United States Patent
Koh et al.

(10) Patent No.: US 7,560,768 B2
(45) Date of Patent: Jul. 14, 2009

(54) NONVOLATILE MEMORY DEVICE AND METHOD OF MANUFACTURING THE SAME

(75) Inventors: Cha-Won Koh, Yongin-si (KR);
Byung-Hong Chung, Seoul (KR);
Sang-Gyun Woo, Yongin-si (KR);
Jeong-Lim Nam, Yongin-si (KR);
Seok-Hwan Oh, Suwon-si (KR);
Jai-Hyuk Song, Seoul (KR); Hyun Park, Hwaseong-si (KR); Yool Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 77 days.

(21) Appl. No.: 11/594,808

(22) Filed: Nov. 9, 2006

(65) Prior Publication Data

US 2007/0111441 A1 May 17, 2007

(30) Foreign Application Priority Data

Nov. 11, 2005 (KR) ...................... 10-2005-0107902

(51) Int. Cl.
*H01L 29/788* (2006.01)
(52) U.S. Cl. ................. 257/316; 438/593; 257/E27.078
(58) Field of Classification Search ......... 257/315–321, 257/E27.078; 438/257–267, 593–594
See application file for complete search history.

(56) References Cited

U.S. PATENT DOCUMENTS 5,480,820 A * 1/1996 Roth et al. ................... 438/257
6,355,525 B1 * 3/2002 Nakagawa ................... 438/257

FOREIGN PATENT DOCUMENTS

| JP | 10-229138 | 8/1998 |
| JP | 2005-085903 | 3/2005 |
| KR | 10-2005-0011501 | 1/2005 |
| KR | 10-2005-0068899 | 7/2005 |

* cited by examiner

*Primary Examiner*—Richard A. Booth
(74) *Attorney, Agent, or Firm*—Harness, Dickey & Pierce, P.L.C.

(57) ABSTRACT

Provided are a nonvolatile memory device and a method of manufacturing the same. A floating gate electrode of the nonvolatile memory device may have a cross-shaped section as taken along a direction extending along a control gate electrode. The floating gate electrode may have an inverse T-shaped section as taken along a direction extending along an active region perpendicular to the control gate electrode. The floating gate electrode may include a lower gate pattern, a middle gate pattern and an upper gate pattern sequentially disposed on a gate insulation layer, in which the middle gate pattern is larger in width than the lower gate pattern and the upper gate pattern. A boundary between the middle gate pattern and the upper gate pattern may have a rounded corner.

8 Claims, 29 Drawing Sheets

NONVOLATILE MEMORY DEVICE AND METHOD OF MANUFACTURING THE SAME

PRIORITY STATEMENT

This U.S. non-provisional patent application claims priority under 35 U.S.C. §119 to Korean Patent Application No. 2005-107902, filed on Nov. 11, 2005, in the Korean Intellectual Property Office (KIPO), the entire contents of which are incorporated herein by reference.

BACKGROUND

1. Field

Example embodiments disclosed herein relate to a semiconductor device and a method of forming the same. Other example embodiments relate to a nonvolatile memory device having a floating gate and a method of forming the same.

2. Description of the Related Art

Memory devices are classified into volatile memory devices and non-volatile memory devices depending on whether or not a power supply is required so as to maintain stored information. Volatile memory devices (e.g., DRAMs and/or SRAMs) may have a relatively rapid operation speed, but power must be continuously supplied so as to maintain stored information. On the contrary, because non-volatile memory devices (e.g., flash memories) may not have such a limitation, they may be being widely used in portable electronic appliances of which demands have sharply increased.

Due to higher integration of semiconductor devices, there may be various technical difficulties in manufacturing non-volatile memory devices. The enhancement of integration may be followed by a decrease in spacing between adjacent word lines, which may make it relatively difficult to improve structures and characteristics of the non-volatile memory devices.

FIG. 1 is a diagram of a cell array of a non-volatile memory device according to the conventional art. Referring to FIG. 1, a device isolation pattern 14 defining an active region 12 may be provided in a semiconductor substrate 10. A floating gate electrode 22 may be provided on the active region 12, and a gate insulation layer 21 may be interposed or inserted between the floating gate electrode 22 and the active region 12. A control gate electrode 24 may be provided over the floating gate electrode 22, crossing the active region 12 and the device isolation pattern 14. The control gate electrode 24 may be used as a word line for selecting a specific cell in a cell array comprised of a plurality of memory cells. An intergate dielectric layer 23 may be interposed or inserted between the control gate electrode and the floating gate electrode 22.

For more rapid and more effective operation of this kind of non-volatile memory device, it may be required that the control gate electrode and the floating gate electrode have a sufficiently large coupling ratio, but the decrease in spacing between the word lines may make it relatively difficult to secure the sufficiently large coupling ratio. The coupling ratio may represent efficiency of a voltage applied to the control gate electrode that may be transferred to the floating gate electrode, and it may depend on a dielectric constant of an insulating layer interposed or inserted therebetween and a coupling area therebetween. To increase the coupling ratio, it may be required to decrease spacing between these electrodes or to increase the dielectric constant of the intergate dielectric layer, but such approaches may have technical limitations. One method to increase the coupling ratio on the present technical level may be to increase the coupling area between those electrodes.

However, according to the conventional art, the increase of the coupling area may cause an increase in electrical interference between the adjacent floating gate electrodes. The reason for the electrical interference may be a parasitic capacitor 'Cfgx' between a floating gate electrode (positioned at the center in FIG. 1) and an adjacent floating gate electrode in the same word line, a parasitic capacitor 'Cfgy' between floating gate electrodes of adjacent word lines, a parasitic capacitor 'Cfgcg' between the floating gate electrode and control gate electrodes of adjacent word lines.

FIG. 3A illustrates a floating gate electrode according to the conventional art, of which section taken along a word line direction may have a rectangle structure or an inverse T structure. In FIG. 3A, while the floating gate electrode having the inverse T shape may have a smaller sectional area compared with the general rectangle structure, it may be understood that a coupling area between the floating gate electrode and the overlying control gate electrode may increase. In the inverse T shaped floating gate structure, the sectional area may be $l_1 h_1 + l_2 h_2$ and the coupling area with the control gate electrode may be proportional to $2(h_1 + h_2) + l_1$.

If the aforementioned electrical interferences are repeated, information stored in a cell may be changed. Considering these facts, the floating gate electrode 22 may have a structure capable of increasing the coupling area between the floating gate electrode 22 and the control gate electrode 24 without increasing a facing area between the floating gate electrode and the control gate electrodes of adjacent word lines and a facing area between the floating gate electrodes of adjacent word lines. However, it may be difficult to do so with the cell structure of the non-volatile memory device according to the conventional art.

SUMMARY

Example embodiments provide a nonvolatile memory device and a method of manufacturing the same having a gate structure that may reduce or minimize an electrical interference between an adjacent word line and a floating gate electrode and simultaneously increase a coupling ratio between the floating gate electrode and a control gate electrode. Example embodiments provide nonvolatile memory devices that may include a device isolation pattern at a region of a substrate to define an active region, a floating gate electrode on the active region and a section of which taken along a direction may have a cross shape, a gate insulation layer between the floating gate electrode and the active region, a control gate electrode on the floating gate electrode to cross the active region and an intergate dielectric layer between the control gate electrode and the floating gate electrode.

In some example embodiments, the direction may correspond to a direction extending along the control gate electrode. A section of the floating gate electrode taken along a direction extending along the active region may have a rectangle or an inverse T shape. In other example embodiments, the floating gate electrode may include a lower gate pattern on the gate insulation layer, a middle gate pattern on the lower gate pattern and an upper gate pattern on the middle gate pattern, wherein the middle gate pattern may be larger in width than the lower gate pattern and the upper gate pattern. A boundary between the middle gate pattern and the upper gate pattern may have a rounded corner. In still other example embodiments, the lower gate pattern may be equal in width to an upper surface of the active region. The upper gate pattern may be smaller in width than the control gate electrode and be covered with the control gate electrode. The control gate electrode may have a bottom surface which may be lower than a bottom surface of the floating gate electrode.

In other example embodiments, nonvolatile memory devices may include a device isolation pattern at a region of a substrate to define an active region, a floating gate electrode on the active region, a gate insulation layer therebetween, and including a first gate pattern and a second gate pattern on the first gate pattern, a control gate electrode on the floating gate electrode, encompassing an intergate dielectric layer and crossing the active region, wherein the second gate pattern may have an upper surface of which width may be smaller than that of the first gate pattern, and a boundary between the first gate pattern and the second gate pattern may be rounded.

In still other example embodiments, methods of forming a nonvolatile memory device may include forming a floating gate pattern on an active region of a substrate defined by a device isolation pattern while encompassing a gate insulation layer between the floating gate pattern and the active region of the substrate, the floating gate pattern being enclosed by the device isolation pattern and having a cross-shaped section taken along a direction; forming an intergate dielectric layer and a control gate conductive layer on the floating gate pattern; and patterning the control gate conductive layer, the intergate dielectric layer and the floating gate pattern to form a control gate electrode crossing the active region, wherein a floating gate electrode may be inserted between the active region and the control gate electrode.

In some example embodiments, forming the floating gate pattern may include sequentially forming a gate insulation layer, a first conductive layer and a hard mask pattern on the semiconductor substrate, etching the first conductive layer using the hard mask pattern as an etch mask to form a first conductive pattern and then etching the semiconductor substrate to form a trench defining the active region, forming a planarized device isolation pattern filling the trench such that the hard mask pattern is exposed, selectively removing the hard mask pattern to form a gap region exposing a side surface of the device isolation pattern and an upper surface of the first conductive pattern, etching the exposed side surface of the device isolation pattern to expand the gap region such that the gap region may have a wider width than the first conductive pattern and forming a second conductive pattern shaped in an inverse T within the gap region.

In other example embodiments, the above methods may further include recessing the device isolation pattern between the floating gate patterns until the top surface of the device isolation pattern may be lowered than the bottom surface of the device isolation pattern. In still other example embodiments, forming the second conductive pattern may include forming a second conductive layer which fills an inside of the gap region and may be planarized to expose the device isolation pattern, recessing the device isolation pattern to expose an upper surface of the second conductive layer and isotropically etching the exposed upper surface of the second conductive layer such that an upper portion of the second conductive layer may be narrower in width than a lower portion of the second conductive layer.

In further still other example embodiments, forming the second conductive pattern may include forming a second conductive layer which fills an inside of the gap region and may be planarized to expose the device isolation pattern, forming a mask pattern having a narrower width than the second conductive layer on the second conductive layer such that both sides of an upper surface of the second conductive layer may be exposed and etching the both exposed sides of the upper surface of the second conductive layer using the mask pattern as an etch mask such that an upper portion of the second conductive layer may be narrower in width than a lower portion of the second conductive layer.

In even other example embodiments, forming the second conductive pattern may include forming a second conductive layer which fills an inside of the gap region and may be planarized to expose the device isolation pattern, forming a mask pattern having a narrower width than the second conductive layer and shaped in a cylinder on the second conductive layer and etching the upper surface of the second conductive layer using the cylinder-shaped mask pattern as an etch mask.

In yet other example embodiments, forming the second conductive pattern may include forming a second conductive layer which fills an inside of the gap region and may be planarized to expose the device isolation pattern, forming a mask pattern crossing the second conductive layer on the second conductive layer; etching the upper surface of the second conductive layer using the mask pattern as an etch mask, recessing the device isolation pattern to expose the upper surface of the second conductive layer and isotropically etching the exposed upper surface of the second conductive layer such that an upper portion of the second conductive layer may be narrower in width than a lower portion of the second conductive layer covered with the device isolation pattern.

The mask pattern may be formed at a place where the control gate electrode is being formed, with a narrower width than the control gate electrode. In still further example embodiments, forming the mask pattern may include forming a mask layer on the planarized second conductive layer and the device isolation layer and forming a mask pattern having a narrower than a minimum line width. In even further example embodiments, forming a mask pattern having a narrower than a minimum line width may include coating and exposing a photoresist film on the mask layer to form a photoresist pattern having a minimum line spacing, decreasing the spacing between the photoresist patterns and then filling an inside of the decreased spacing with an organic material containing silicon, removing the photoresist pattern to form an organic pattern and patterning the mask layer using the organic pattern as an etch mask.

Decreasing the spacing may be performed by a variety of methods. In a first method, decreasing the spacing may be performed by flowing the photoresist pattern. In a second method, the decreasing of the spacing may include: forming an organic layer on the photoresist pattern; thermally annealing the organic layer such that some of the organic layer reacts with the photoresist pattern and may be attached on the photoresist pattern; and removing non-reacted organic layer. In a method, decreasing the spacing may include forming an organic layer on the photoresist pattern; flowing the photoresist pattern to decrease the spacing; and removing the organic layer.

BRIEF DESCRIPTION OF THE FIGURES

Example embodiments will be more clearly understood from the following detailed description taken in conjunction with the accompanying drawings. FIGS. 1-15D represent non-limiting, example embodiments as described herein.

FIG. 1 is a diagram partially illustrating a cell array of a nonvolatile memory device according to a conventional art;

FIG. 13 is a diagram illustrating a flow method to decrease a spacing between photoresist patterns;

FIGS. 15A to 15D are diagrams illustrating another example to decrease a spacing between photoresist patterns.

DETAILED DESCRIPTION OF EXAMPLE EMBODIMENTS

Figure 1:
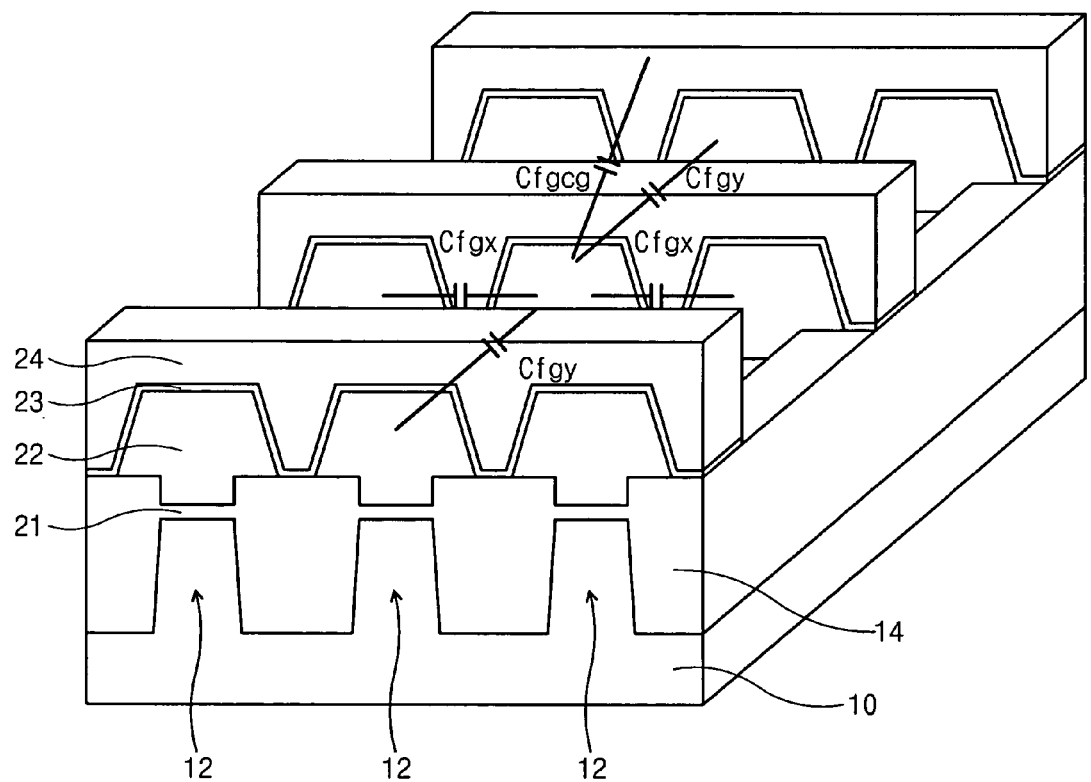

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

It will be understood that, although the terms first, second, third, and the like may be used herein to describe various regions, layers, and the like, these regions, layers, and the likes should not be limited by these terms. These terms are only used to distinguish one region, layer, and the like from another region, layer, and the like. A first layer mentioned in example embodiments could be termed a second layer in other example embodiments without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
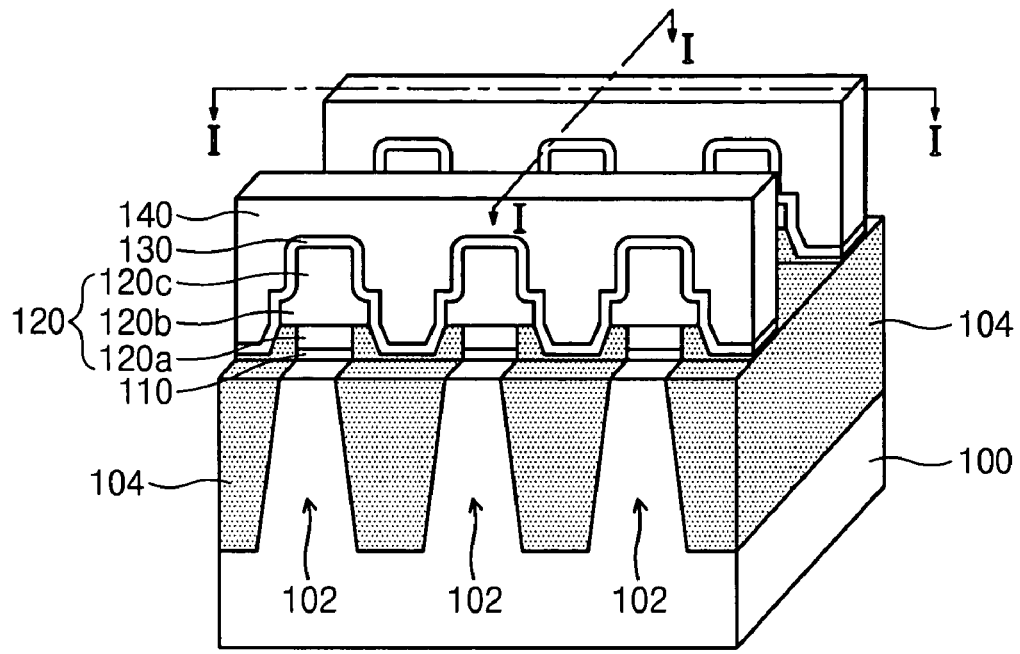
FIG. 2A is a diagram of a nonvolatile memory device according to example embodiments.
Figure 2B:
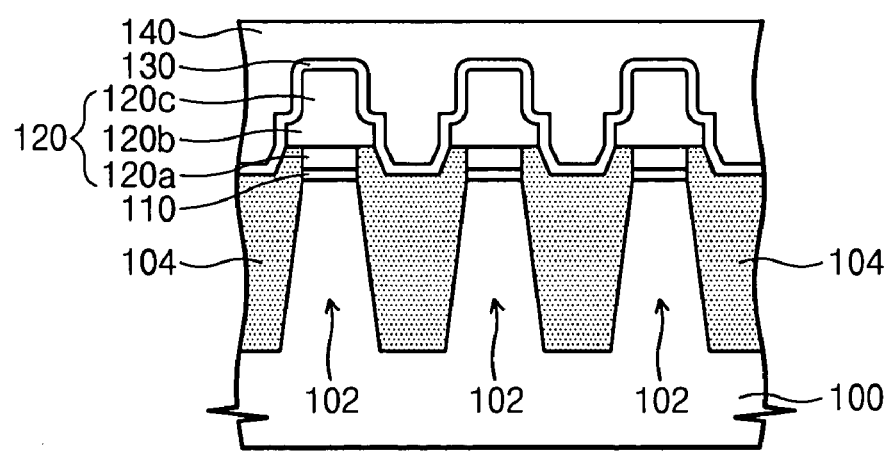
FIG. 2B is a diagram of line I-I of FIG. 2A.
Figure 2C:
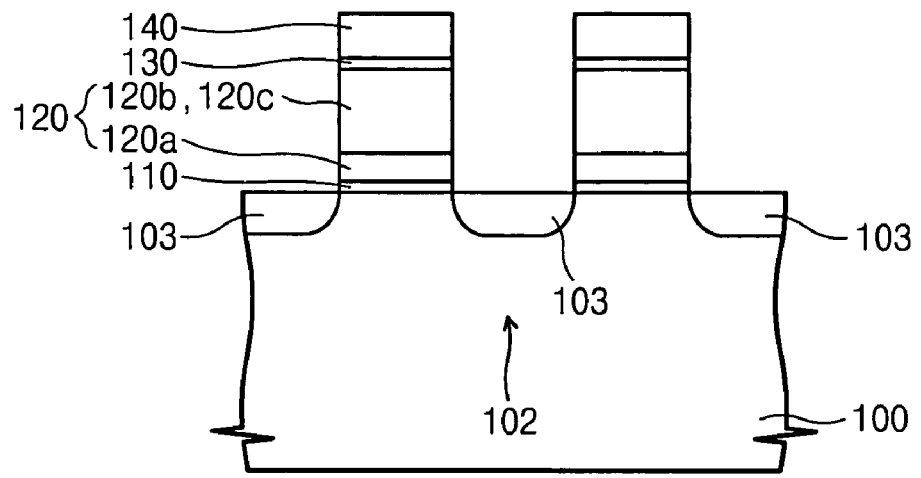
FIG. 2C is a diagram of line I'-I' of FIG. 2A.
Figure 2D:
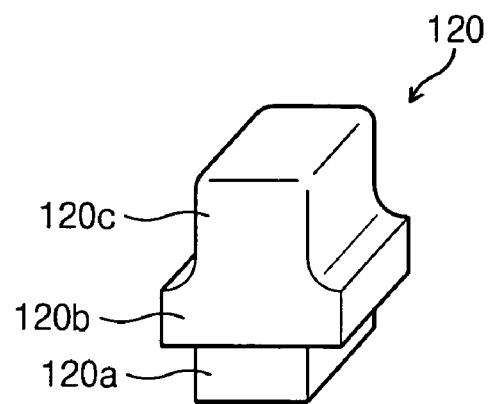
FIG. 2D is a diagram of a floating gate electrode according to example embodiments.

In order to describe a nonvolatile memory device and a method of manufacturing the same according to example embodiments, a flash memory device may be described. FIG. 2A is a diagram of a nonvolatile memory device according to example embodiments, FIG. 2B is a diagram of line I-I of FIG. 2A, FIG. 2C is a diagram of line I'-I' of FIG. 2A, and FIG. 2D is a diagram of a floating gate electrode according to example embodiments.

Referring to FIGS. 2A, 2B, 2C and 2D, in a nonvolatile memory device according to example embodiments, a device isolating layer pattern 104 may be disposed on a predetermined or given region of a semiconductor substrate 100 to define an active region. A gate insulation layer 110 may be disposed on the active region and a floating gate electrode 120 may be disposed on the gate insulation layer 110. The floating gate electrode 120 may have a cross-shaped section taken along a predetermined or given direction. As shown in the drawing, the predetermined or given direction may be, for example, a direction extending along a control gate electrode. On the floating gate electrode 120, an intergate dielectric layer 130 and a control gate electrode 140 may be disposed. The control gate electrode 140, the intergate dielectric layer 130 and the floating gate electrode 120 may constitute a word line structure for selecting a predetermined or given cell in a cell array. The control gate electrode 140 may be disposed in a direction crossing over the active region 102 and the device isolation pattern 104.

The gate insulation layer 110 may be a silicon oxide layer having a thickness ranging from about 20 Å to about 200 Å and/or may be a metal oxide layer having a high dielectric constant. The floating gate electrode 120 may include a lower gate pattern 120a, a middle gate pattern 120b, and an upper gate pattern 120c. The lower gate pattern 120a, the middle gate pattern 120b, and the upper gate pattern 120c may be made of a polysilicon layer. The lower gate pattern 120a, the middle gate pattern 120b, and the upper gate pattern 120c may have a thickness of about 150 Å, about 150 Å, and about 400 Å, respectively.

The middle gate pattern 120b may be wider than the lower gate pattern 120a and the upper gate pattern 120c. A section taken along a direction extending along the control gate electrode may be shaped in a cross. A section taken along a direction extending along the active region perpendicular to the control gate electrode may be shaped in a rectangle. Referring to FIG. 2B, while it is shown that the lower gate pattern 120a, the middle gate pattern 120b, and the upper gate pattern 120c may have a shape similar to a rectangle, their shapes may not be limited thereto and may be changed if an approximate width of the middle gate pattern is wider than a width of the lower gate pattern and/or the upper gate pattern. The width of the lower gate pattern may be the same and/or different than that of the upper gate pattern. A corner of a boundary between the middle gate pattern and the upper gate pattern may be rounded. The width of the lower gate pattern may be the same as that of the upper surface of the active region.

The intergate dielectric layer 130 may have a stack structure comprised of an about 30 Å to about 80 Å silicon oxide layer, an about 50 Å to about 150 Å silicon nitride layer, and an about 30 Å to about 100 Å silicon oxide layer. The intergate dielectric layer 130 may be a high dielectric material layer selected from the group consisting of an aluminum oxide ($Al_2O_3$) layer, a hafnium oxide (HfO) layer, a hafnium aluminum oxide (HfAlO) layer and a hafnium silicon oxide (HfSiO) layer. The control gate electrode 140 may be formed of at least one selected from the group consisting of polysilicon, silicide, metal and/or a combination thereof. The control gate electrode 140 may have a bottom surface which is lower than a bottom surface of the floating gate pattern 120. A top surface of the device isolation pattern 104 between the floating gate electrodes 120 may be lower than a top surface of the active region 102. Impurity ions may be provided into the active region 102 between word line structures to form impurity regions 103.

The above structure may increase a distance between the adjacent upper gate patterns and a distance between the adjacent lower gate patterns in the word line direction, thus decreasing an electrical interference Cfx due to a parasitic capacitance between the adjacent floating gate electrodes in the same word line. Because the width of the lower gate pattern is formed narrower than the width of the middle gate pattern, the intergate dielectric layer may not be formed on the lower gate pattern. A disturbance caused by the intergate dielectric layer being closer to the gate insulation layer may be decreased, thereby enhancing the reliability of the nonvolatile memory device.

Figure 3A:
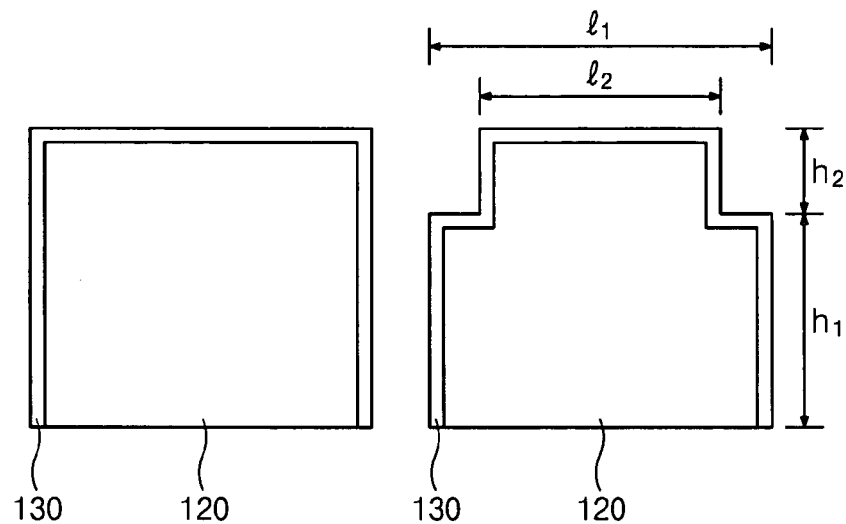
FIGS. 3A and 3B are diagrams that respectively illustrate a floating gate electrode with a section taken along a word line direction that may have an inverse T structure and a floating gate electrode with a section taken along a word line direction that may have a cross structure, for comparison therebetween.
Figure 3B:
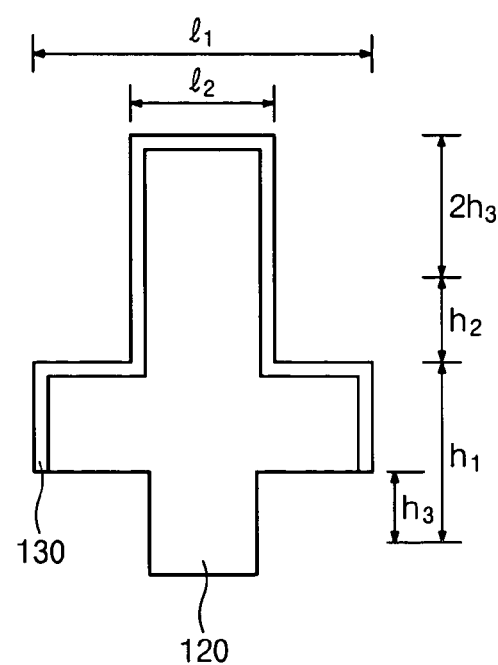

FIG. 3B illustrates a floating gate electrode according to example embodiments, of which a section, taken along the word line direction, may have a cross structure. In the cross-shaped floating gate structure, the sectional area may be $l_1h_1 + l_2h_2$ and the coupling area may be proportional to $2(h_1+h_2) + l_1 + 2h_3$. While the cross-shaped floating gate electrode according to example embodiments may have the same sectional area as an inverse T shaped floating gate electrode shown in FIG. 3A, it may have an increased coupling area with the control gate electrode to be proportional to $2h_3$. While the sectional area of the floating gate electrode is decreased to decrease the parasitic capacitance due to the control gate electrode and the floating gate electrode of the adjacent word line, it may be possible to maintain an equal coupling area with the control gate electrode.

The decrease in the sectional area of the floating gate electrode may result in a decrease in the electrical interference effect due to the parasitic capacitors Cfy, Cfgcg generated between a selected floating gate electrode and another floating gate electrode corresponding to an adjacent word line and between the selected floating gate electrode and a floating gate electrode corresponding to the adjacent word line. The decrease in the electrical interference effect may provide a process margin that is capable of increasing the surface area of the floating gate electrode. The floating gate electrode according to example embodiments may make it possible to increase the coupling area determining the coupling ratio, while maintaining a maximal sectional area to suppress the electrical interference effect. The increase in the coupling area may increase the coupling ratio which represents efficiency that a voltage applied to the control gate electrode 140 may be transferred to the floating gate electrode 120. The recessed structure formed in the top surface of the device isolation pattern 104 may enable example embodiments to have an increased coupling area.

Figure 4A:
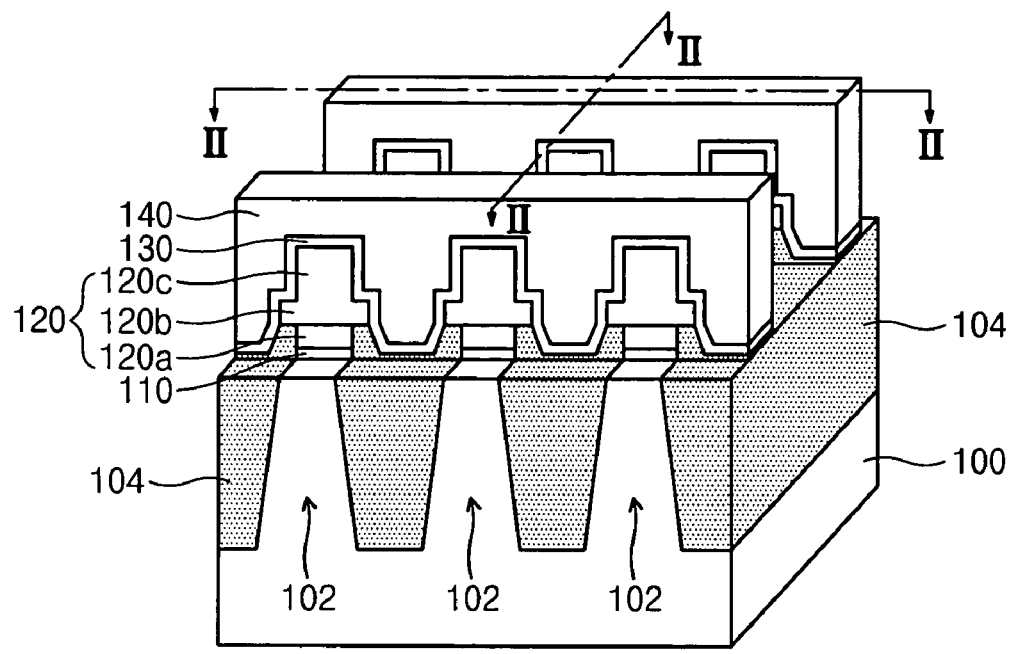
FIG. 4A is a diagram of a nonvolatile memory device according to example embodiments.
Figure 4B:
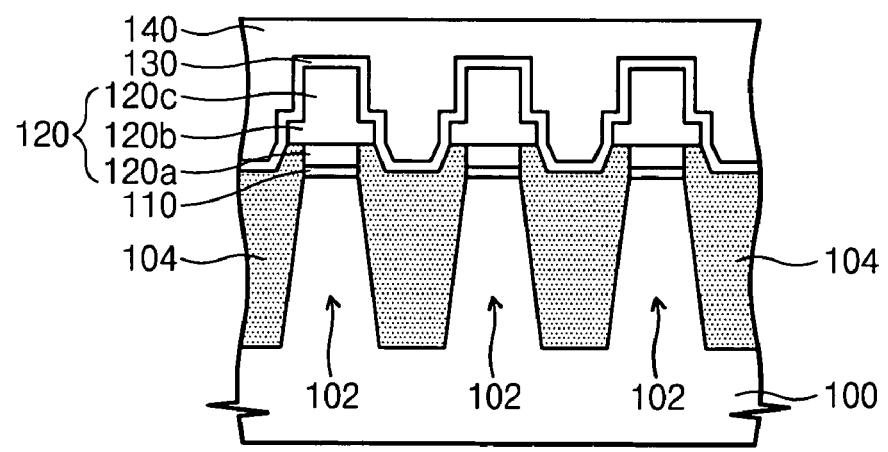
FIG. 4B is a diagram of line II-II of FIG. 4A.
Figure 4C:
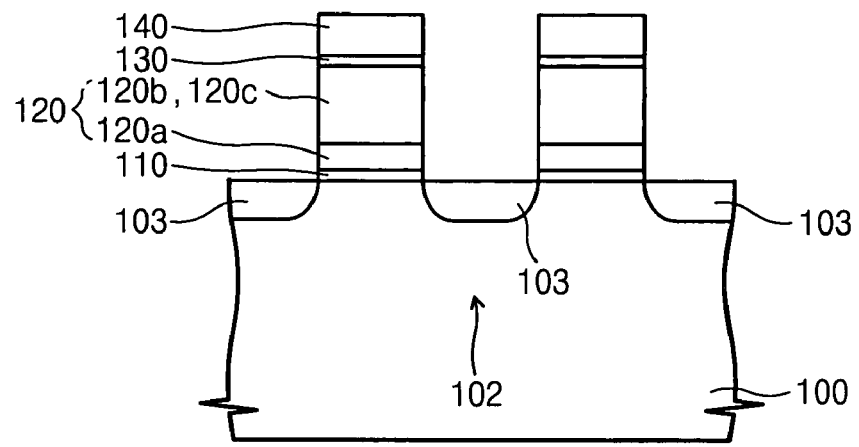
FIG. 4C is a diagram of line II'-II' of FIG. 4A.
Figure 4D:
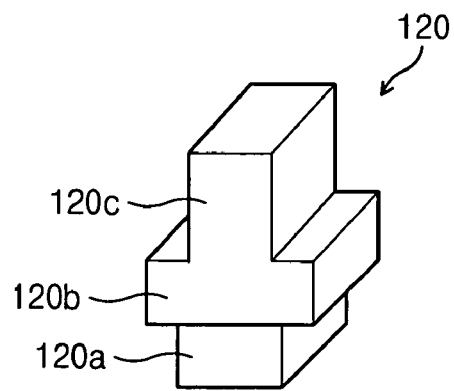
FIG. 4D is a diagram of a floating gate electrode according to example embodiments.

FIG. 4A is a diagram of a nonvolatile memory device according to example embodiments, FIG. 4B is a diagram of line II-II of FIG. 4A, FIG. 4C is a diagram of line II'-II' of FIG. 4A, and FIG. 4D is a diagram of a floating gate electrode according to example embodiments. Like reference numerals in the drawings denote like elements. Referring to FIGS. 4A, 4B, 4C and 4D, a nonvolatile memory device according to example embodiments may have a similar structure to that of the example embodiment in FIGS. 2A-2D. However, it may be noted that a corner of a boundary between a middle gate pattern and an upper gate pattern may have a right angle. A top surface of the upper gate pattern may have an angled corner. Owing to the similarity in the structure, the nonvolatile memory device according to the example embodiment illustrated in FIGS. 4A-4D may have similar effects to that of the example embodiment illustrated in FIGS. 2A-2D.

Figure 5A:
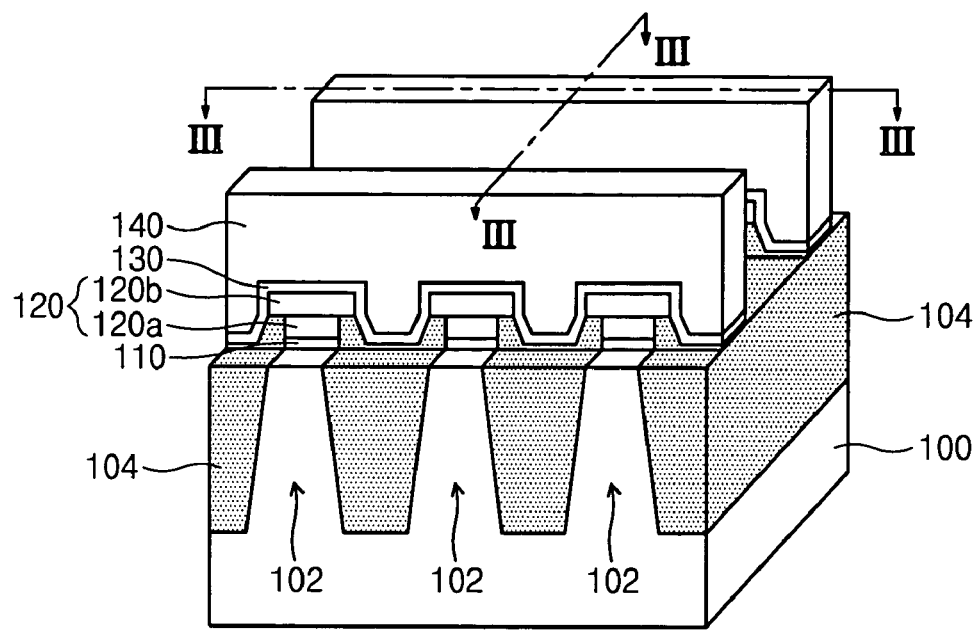
FIG. 5A is a diagram of a nonvolatile memory device according to example embodiments.
Figure 5B:
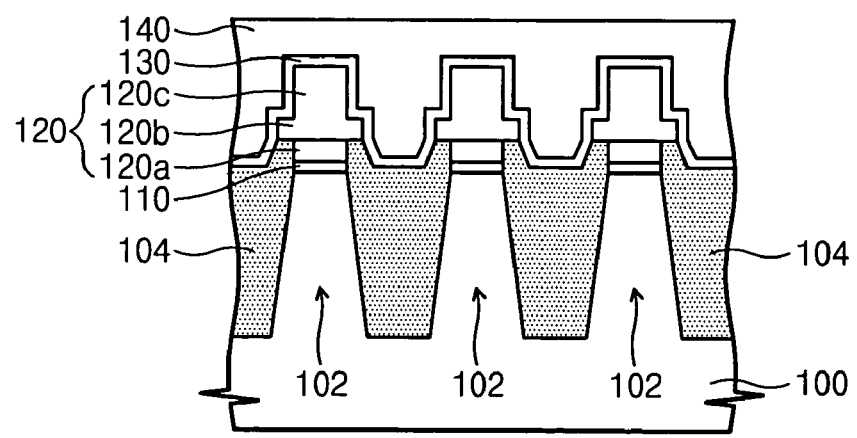
FIG. 5B is a diagram of the line III-III of FIG. 5A.
Figure 5C:
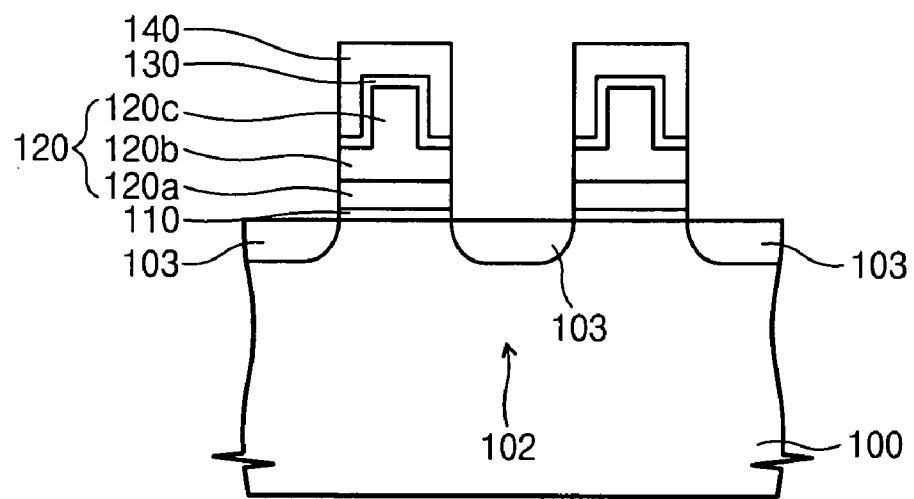
FIG. 5C is a diagram of the line III'-III' of FIG. 5A.
Figure 5D:
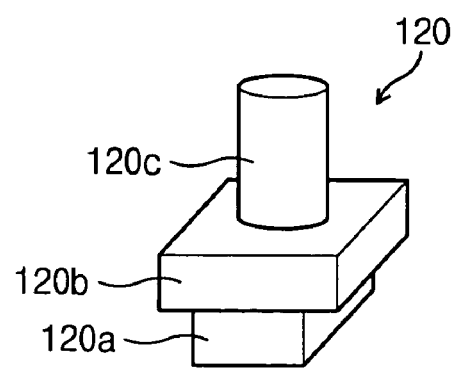
FIG. 5D is a diagram of a floating gate electrode according to example embodiments.

FIG. 5A is a diagram of a nonvolatile memory device according to example embodiments, FIG. 5B is a diagram of line III-III of FIG. 5A, FIG. 5C is a diagram of line III'-III' of FIG. 5A, and FIG. 5D is a diagram of a floating gate electrode according to example embodiments. Like reference numerals in the drawings denote like elements. Referring to FIGS. 5A, 5B, 5C and 5D, a section of a floating gate electrode 120 taken along a direction extending along a control gate electrode may have a cross shape. A section of the floating gate electrode 120 taken along a direction extending along an active region perpendicular to the control gate electrode may have an inverse T shape. An upper gate pattern 120c may be shaped in a pillar protruded from a middle gate pattern 120b. The pillar shaped upper gate pattern 120c may be cylindrical. A corner of a boundary between the middle gate pattern 120b and the upper gate pattern 120c may have a right angle. A bottom surface of the control gate electrode may have a surface corresponding to the pillars of the floating gate electrodes 120. A lower gate pattern 120a, the middle gate pattern 120b, and the upper gate pattern may have a thickness of about 150 Å, about 150 Å, and about 400 Å, respectively.

According to the structure of the example embodiment in FIGS. 5A-5D, an additional effect in addition to the effects of example embodiments is generated. As shown in FIG. 5C, a coupling area between the floating gate electrode and the control gate electrode may be increased corresponding to the surface of the pillar-shaped upper gate pattern, so that a coupling ratio between the floating gate electrode and the control gate electrode may be increased. A distance between the protruded upper gate pattern 120c and the floating gate electrode of a same word line may be increased, and thus an electrical interference Cfx due to a parasitic capacitor between the adjacent floating gate electrodes of the same word line may be decreased. Distances between the protruded upper gate pattern 120c and the floating gate electrode and the control gate electrode of an adjacent word line may be increased. Because the control gate electrode is formed to completely enclose the upper gate pattern 120c of the floating gate electrode, a parasitic capacitance Cfy generated between floating gate electrodes of adjacent word lines may be decreased. An electrical interference due to a parasitic capacitor Cfgcg between a floating gate electrode and control gate electrodes of adjacent word lines may be decreased.

Figure 6A:
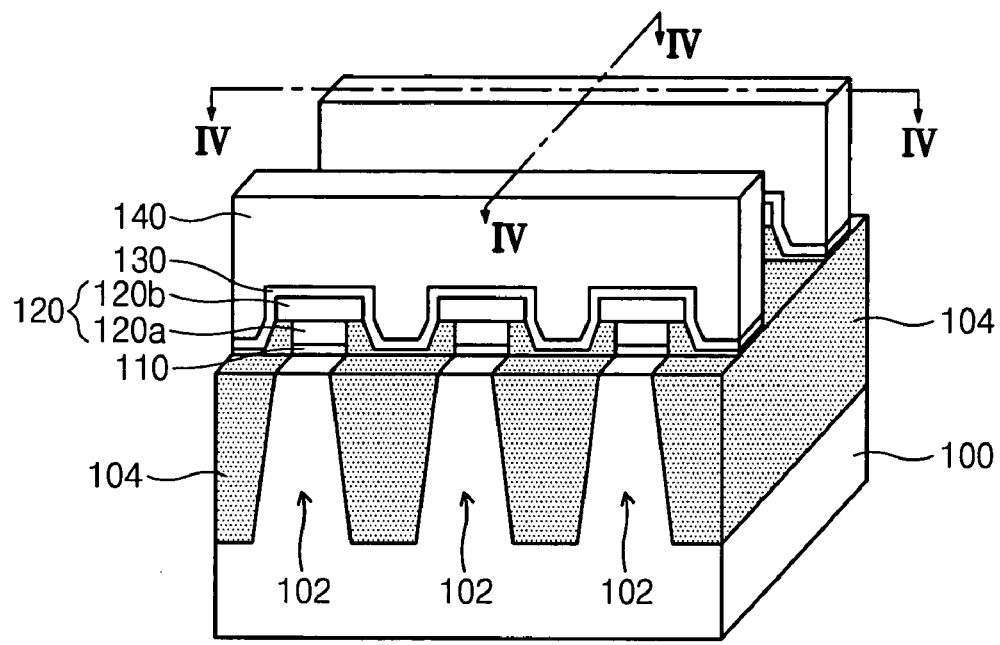
FIG. 6A is a diagram of a nonvolatile memory device according to example embodiments.
Figure 6B:
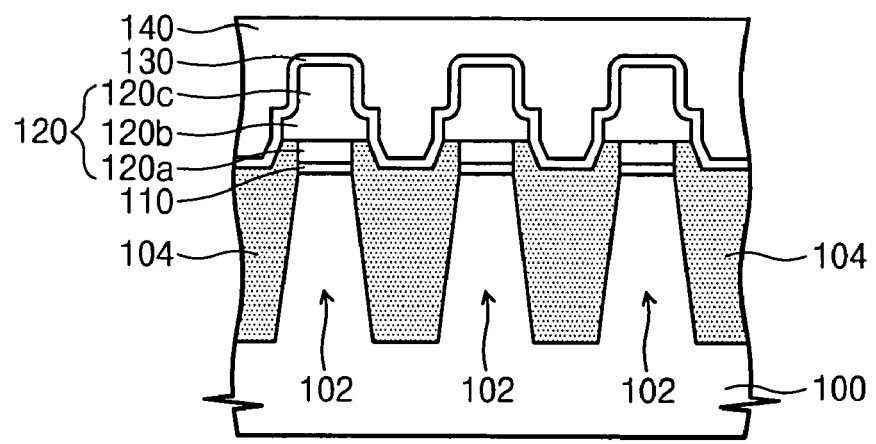
FIG. 6B is a diagram of line IV-IV of FIG. 6A.
Figure 6C:
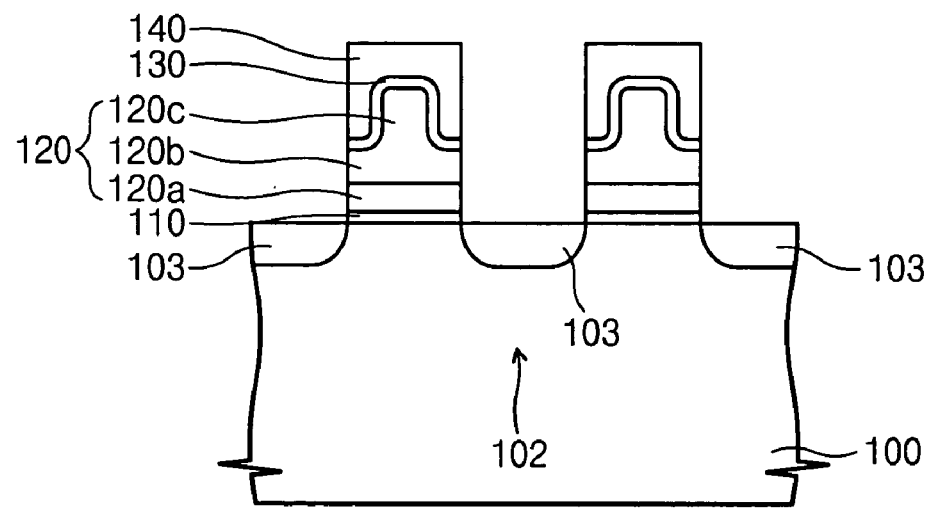
FIG. 6C is a diagram of line IV'-IV' of FIG. 6A.
Figure 6D:
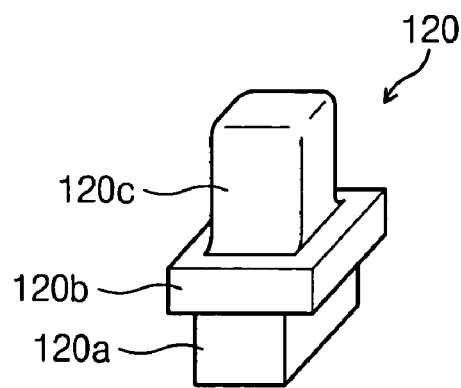
FIG. 6D is a diagram of a floating gate electrode according to example embodiments.

FIG. 6A is a diagram of a nonvolatile memory device according to example embodiments, FIG. 6B is a diagram of line IV-IV of FIG. 6A, FIG. 6C is a diagram of line IV'-IV' of FIG. 6A, and FIG. 6D is a diagram of a floating gate electrode according to example embodiments. Like reference numerals in the drawings denote like elements. Referring to FIGS. 6A, 6B, 6C and 6D, a nonvolatile memory device according to example embodiments may have a similar structure to that of the example embodiment in FIGS. 5A-5D. However, it may be noted that a corner of a boundary between a middle gate pattern 120b and an upper gate pattern 120c may be rounded, unlike the example embodiment in FIGS. 5A-5D. The upper gate pattern 120c may not be cylindrical but be in a rectangular pillar shape. This rectangular pillar shaped upper gate pattern 120c may be modified such that its corner is rounded.

Figure 7A:
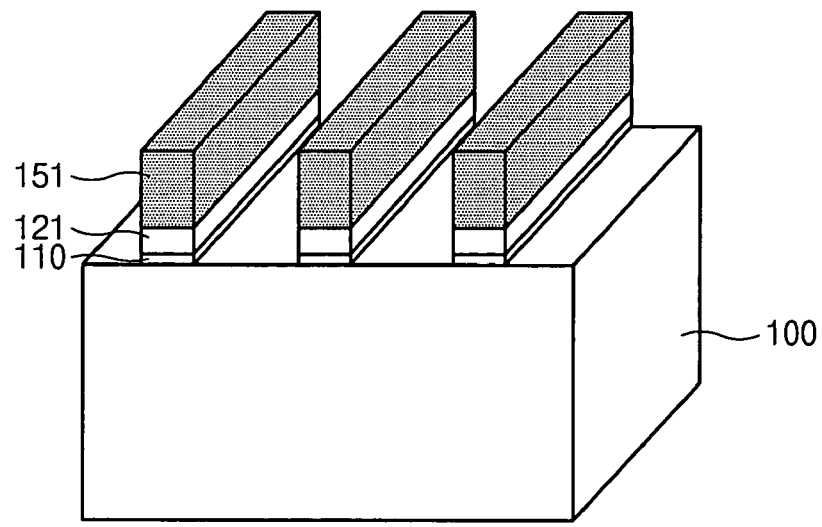
FIGS. 7A to 7H are diagrams illustrating a method of manufacturing a nonvolatile memory device according to example embodiments.

Due to the similarity in the structure, the nonvolatile memory device according to the example embodiment illustrated in FIGS. 6A-6D may have similar effects to those mentioned in the example embodiment illustrated in FIGS. 5A-5D. Hereinafter, a method of manufacturing the nonvolatile memory device described with reference to FIGS. 2-6 will be described. FIGS. 7A to 7H are diagrams for illustrating a method of manufacturing a nonvolatile memory device according to example embodiments. Referring to FIG. 7A, an insulating layer and a first conductive layer may be formed on a semiconductor substrate 100. The insulating layer may be made of silicon oxide by a thermal oxidation process having a thickness ranging from about 20 Å to about 200 Å. The insulating layer may be a metal oxide layer having a high dielectric constant. The first conductive layer may be an impurity-doped polysilicon layer.

A hard mask pattern 151 may be formed on the semiconductor substrate 100 having the first conductive layer formed thereon. The hard mask pattern 151 may be formed of silicon nitride. The hard mask pattern 151 may further include a silicon oxide layer (e.g., medium temperature oxide, "MTO") and an antireflective layer sequentially stacked on the silicon nitride layer. Additionally, types, thicknesses and stacking order of layers constituting the hard mask pattern 151 may be variously modified. A dry etch process may be performed using the hard mask pattern 151 as an etch mask, to form a first conductive pattern 121 and a gate insulation layer 110.

Figure 7B:
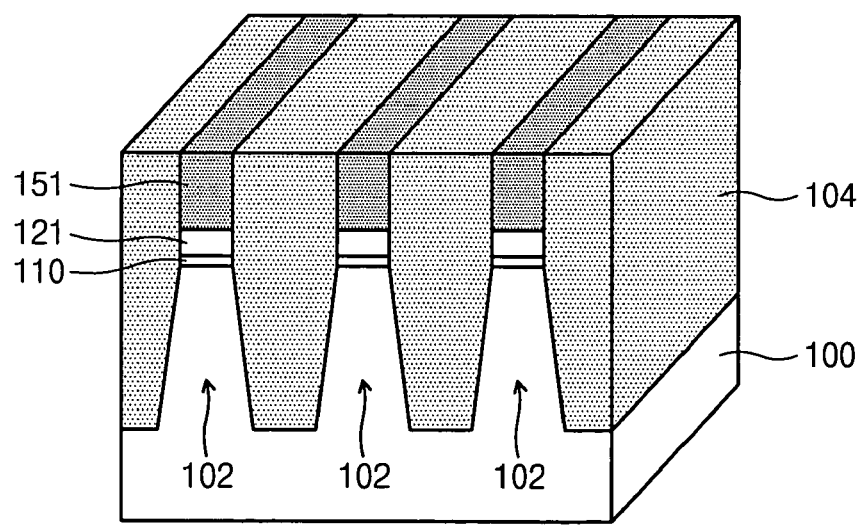

Referring to FIG. 7B, the semiconductor substrate 100 may be etched using the hard mask pattern 151 as an etch mask to form device isolation trenches (hereinafter referred to as 'trenches') defining an active region. Forming the trenches may include a process of anisotropically etching the semiconductor substrate 100 using an etching process having an etch selectivity for the semiconductor substrate 100 over the hard mask pattern 151. A device isolation layer filling the trenches may be formed on the resultant substrate having the trenches. The device isolation layer may be etched until a top surface of the hard mask pattern 151 is exposed, thereby forming a planarized device isolation pattern 104 enclosing the hard mask pattern 151. The anti-reflective layer may be removed at this time or before the device isolation layer is formed.

In example embodiments, the device isolation layer may be made of a silicon oxide layer. The device isolation layer may be made of a silicon oxide layer, a polysilicon layer, an epitaxial silicon layer and/or a porous insulating layer. A thermal oxide layer (not shown) for curing etch damage generated during the etching of the semiconductor substrate 100 may be formed on an inner wall surface of the trench before the device isolation layer is formed. A liner layer (not shown) for reducing or preventing impurities from being penetrated into the active region 102 may be further formed on the resultant semiconductor substrate having the thermal oxide layer formed thereon. The liner layer may be a silicon nitride layer. The etching of the device isolation layer may include a chemical mechanical polishing (CMP) process which uses a slurry having an etch selectivity for the device isolation layer over the hard mask pattern 151. The etching of the device isolation layer may be performed by a dry etch, a wet etch and/or a blanket etch.

Figure 7C:
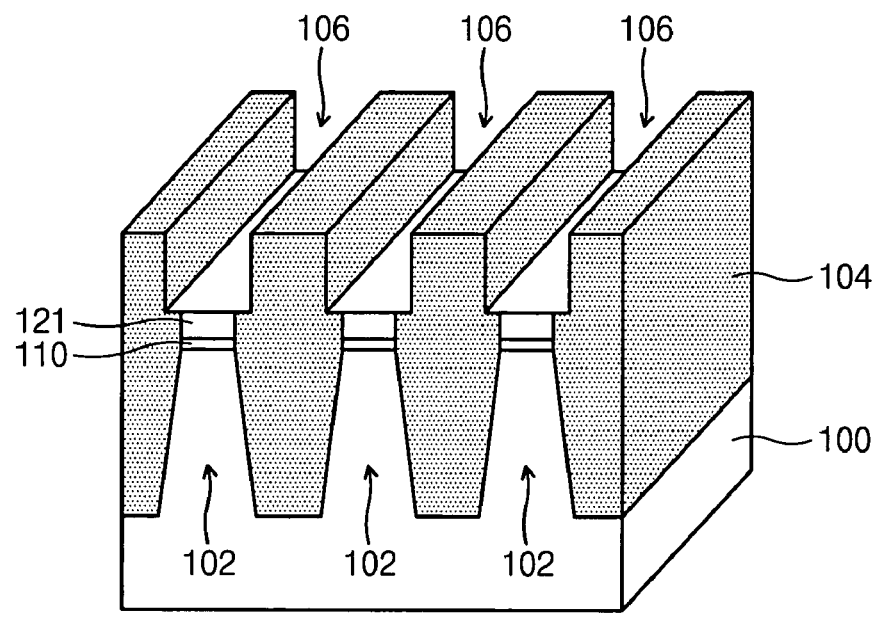

Referring to FIG. 7C, the hard mask pattern 151 may be selectively removed to form a gap region 106 exposing side surfaces of the device isolation patterns 104 and a top surface of the first conductive pattern 121. In more detail, a wet etch process having an etch selectivity for the device isolation pattern 104 rather than the hard mask pattern 151 may be performed to form the gap region. The exposed side surfaces of the device isolation patterns 104 may be etched by a predetermined or given thickness while the hard mask pattern 151 is removed. The exposed side surfaces of the device isolation patterns 104 may be etched by an etch process following the process of removing the hard mask pattern 151. The following etch process may be a wet etch process having an etch selectivity for the device isolation pattern material. The exposed side surfaces of the device isolation patterns 104 may be etched by removing the hard mask pattern 151 and then performing a blanket etch back with respect to the device isolation pattern 104. The width of the gap region 106 may extend to have a larger width than the first conductive pattern 121.

A second conductive pattern 123' shaped in an inverse T may be formed within the gap region 106, so that a floating gate pattern 125 comprised of the first conductive pattern 121 and the second conductive pattern 123' may be formed. The floating gate pattern 125 interposing the gate insulation layer 110, surrounded by the device isolation pattern 104 and having a section taken along a direction (e.g., direction of a control gate electrode which is being formed) perpendicular to the active region shaped in a cross may be formed on the active region. In example embodiments, example embodiments for forming the inverse T-shaped second conductive pattern 123' may be disclosed. A method of forming the inverse T-shaped second conductive pattern 123' according to example embodiments may be disclosed.

Figure 7D:
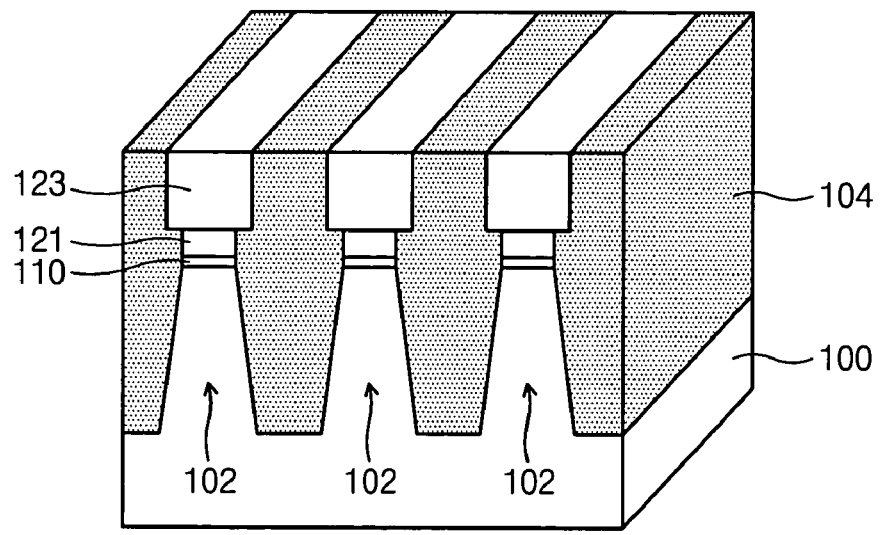

Referring to FIG. 7D, a second conductive layer 123 filling the extended gap region 106 may be formed. The second conductive layer 123 may be formed of impurity-doped polysilicon layer by a chemical vapor deposition process. The second conductive layer may be etched until a top surface of the device isolation pattern 104 is exposed. This etch process may be performed by a planarization process under an etch condition having an etch selectivity for the second conductive layer over the device isolation pattern 104. For example, the planarization process may be performed by a chemical mechanical polishing process, and slurry may be formed of a material that may have a faster etch rate with respect to polysilicon rather than silicon oxide. Because the width of the gap region 106 is extended, the width of the second conductive layer 123 may be larger than that of the first conductive pattern 121.

Figure 7E:
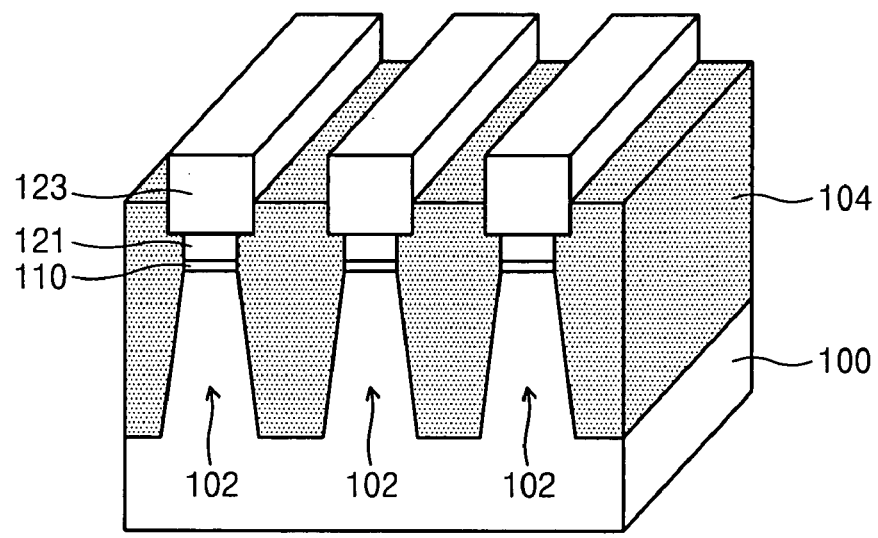

Referring to FIG. 7E, the device isolation pattern may be recessed to expose upper side surfaces of the second conductive layer 123. The recessing may be performed under an etch condition having an etch selectivity for the device isolation pattern over the second conductive layer 123, so that the device isolation pattern 104 may be blanket-etched and/or wet-etched. The recessed depth may depend on height of the upper gate pattern shown in FIGS. 2A, 2B and 2C and a top surface of the recessed device isolation pattern may be higher than the top surface of the middle gate pattern.

Figure 7F:
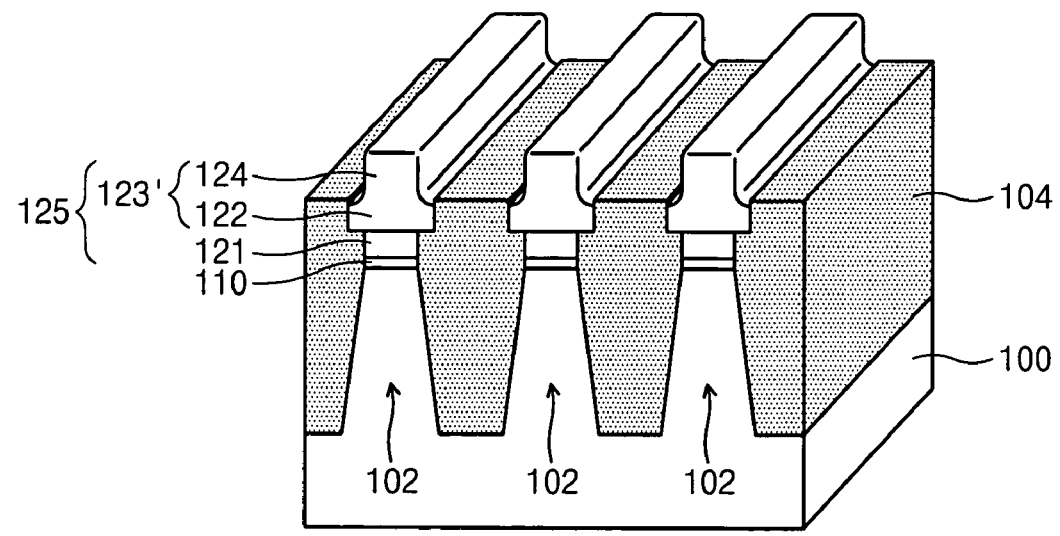

Referring to FIG. 7F, the second conductive layer of which the top surface is exposed may be isotropically etched to form a second conductive pattern 123'. An upper portion 124 of the second conductive pattern 123' may have a narrower width than a lower portion 122. A section of the second conductive pattern 123' may have an inverse T shape. The first conductive pattern 121 and the second conductive pattern 123' form a floating gate pattern 125. The formed floating gate pattern 125 may have a cross-shaped section as taken along a direction (direction of control gate electrode which is being formed) perpendicular to the active region. The isotropic etching of the second conductive layer 123 may be performed by an etching method that selectively etches the second conductive layer 123 rather than the device isolation pattern 104. A wet etching method and/or a chemical dry etching method using fluorine (F) gas may be used. In the chemical dry etching method, a bias may not be applied to the substrate, for the isotropic etching. As the second conductive layer 123 is isotropically etched, a corner of a boundary between the upper portion 124 of the second conductive pattern and the lower portion 122 may be rounded.

Figure 7G:
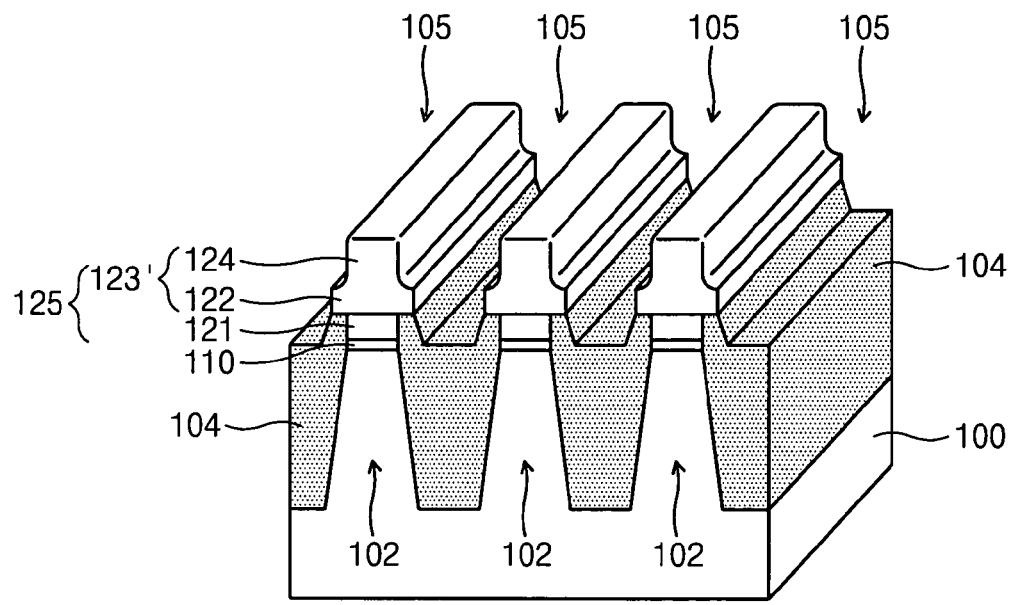

Referring to FIG. 7G, the exposed top surface of the device isolation pattern 104 may be etched using the second conductive pattern 123' as an etch mask. By doing so, the top surface of the device isolation pattern 104 may be recessed and may be leveled lower than the first conductive pattern 121. The recess 105 shown in FIG. 7G may have an angled edge, but it may have a rounded edge. Because the width of the second conductive pattern 123' is larger than that of the active region 102, etch damage with respect to the active region 102 and the gate insulation layer 110 may be reduced or prevented during the recessing of the device isolation pattern 104. Considering that the recessing of the device isolation pattern 104 may be performed until the top surface of the device isolation pattern 104 may be lower than the top surface of the active region 102, a reduction may be apparent. For the reduction or prevention of the etch damage, it may be required to extend the width of the gap region 106.

Figure 7H:
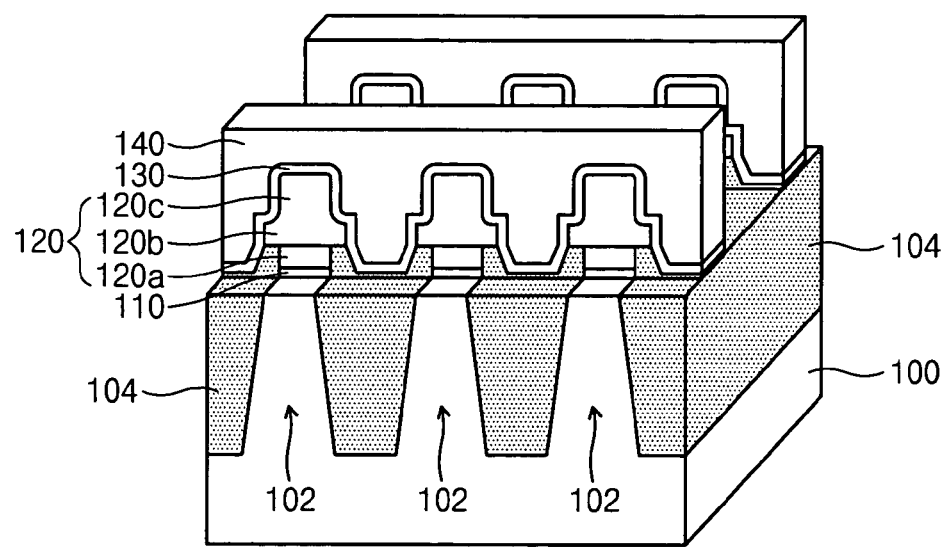

Referring to FIG. 7H, a word line structure crossing over the active region may be formed on the resultant substrate having the device isolation pattern 104 of which top surface is recessed. The word line structure may include a floating gate electrode 120, an intergate dielectric layer 130 and a control gate electrode 140 sequentially stacked. Forming the word line structure may include sequentially forming an intergate dielectric layer and a control gate conductive layer on an upper surface of the resultant substrate having the device isolation pattern 104 of which the top surface is recessed, and patterning the control gate conductive layer, the intergate dielectric layer and the floating gate pattern 125 to expose the active region 102. By patterning, the first conductive pattern 121, the lower portion 122 of the second conductive pattern and the upper portion 124 of the second conductive pattern constituting the floating gate pattern 125 may be respectively changed into a lower gate pattern 120a, a middle gate pattern 120b and an upper gate pattern 120c, to form a floating gate electrode 120. Because a distance between the upper portions 124 of the adjacent floating gate patterns is wider than that between the lower portions 122 of the adjacent floating gate patterns, the control gate conductive layer may be formed without any void.

The floating gate electrode 120 may have the cross-shaped section as taken along a direction extending along the control gate electrode 140. The section as taken along the direction of the active region may have a rectangular shape. Impurity ions having a conductive type opposite to that of the semiconductor substrate may be implanted into the active region using the word line structure as a mask to form an impurity region (103 of FIG. 2). The intergate dielectric layer 130 may have a stack structure comprised of an about 30 Å to about 80 Å silicon oxide layer, an about 50 Å to about 140 Å silicon nitride layer, and an about 30 Å to about 100 Å silicon oxide layer. The intergate dielectric layer 130 may be a single layer or a multilayer selected from the group consisting of an aluminum oxide ($Al_2O_3$) layer, a hafnium oxide (HfO) layer, a hafnium aluminum oxide (HfAlO) layer and/or a hafnium silicon oxide (HfSiO) layer. The control gate electrode 140 may be formed of at least one selected from the group consisting of polysilicon, silicide, metal and/or combinations thereof.

Figure 8A:
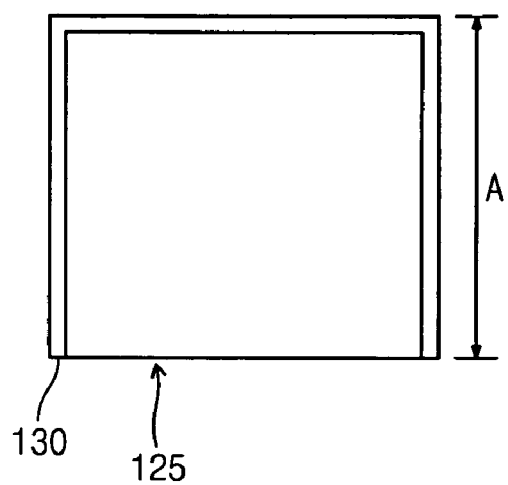
FIGS. 8A and 8B are diagrams illustrating a process of removing a intergate dielectric layer for a nonvolatile memory device.

In a nonvolatile memory device including a floating gate electrode having a general shape, while the intergate dielectric layer is etched, the underlying floating gate electrode may be over-etched. In order to form the word line structure, the control gate electrode may be formed using a mask pattern (not shown) as an etch mask, the intergate dielectric layer exposed at both sides of the control gate electrode may be removed and the floating gate pattern may be etched. Referring to FIG. 8A, while a side portion of the intergate dielectric layer 130 having a height 'A' is removed, the intergate dielectric layer on the floating gate pattern may be completely removed and then the floating gate pattern may start to be etched, and thus the floating gate electrode may be damaged. Such an etch damage may be conspicuous under an etch condition that an etch selectivity for the intergate dielectric layer may not be higher than that for the floating gate pattern material. The cross-shaped floating gate pattern according to example embodiments may not cause or decrease such an etch damage.

Figure 8B:
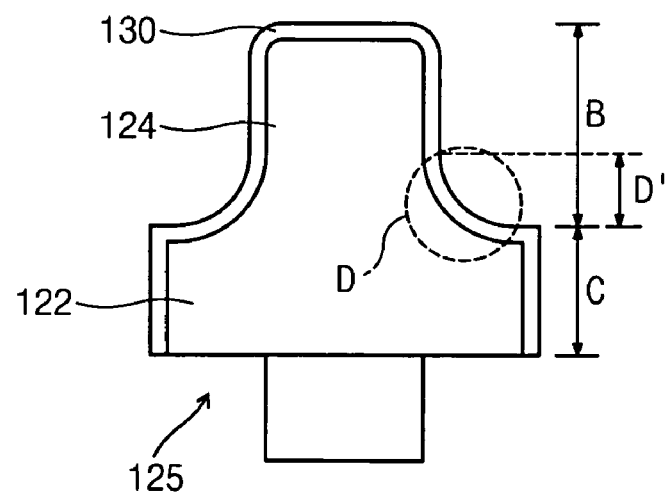

Referring to FIG. 8B, because side portions 'B' and 'C' of the intergate dielectric layer 130 may be simultaneously exposed, they may be simultaneously etched and thus a time of removing the intergate dielectric layer may be decreased. Because a corner 'D' between the upper portion 124 of the second conductive pattern and the lower portion 122 of the second conductive pattern may have a rounded shape, a portion, which is simultaneously exposed, may be increased. If the etching is performed by a height corresponding to B–D', the intergate dielectric layer may be completely removed. Because height 'C' is smaller than height 'B', when the portion corresponding to the height 'B' is removed, the portion corresponding to height 'C' may be completely removed. In example embodiments, only the portion corresponding to the height difference 'B–D' may be etched and thus the intergate dielectric layer 130 may be removed within a shorter time. While the intergate dielectric layer is etched, the underlying floating gate pattern 125 may not be damaged or may be less damaged.

Figure 9A:
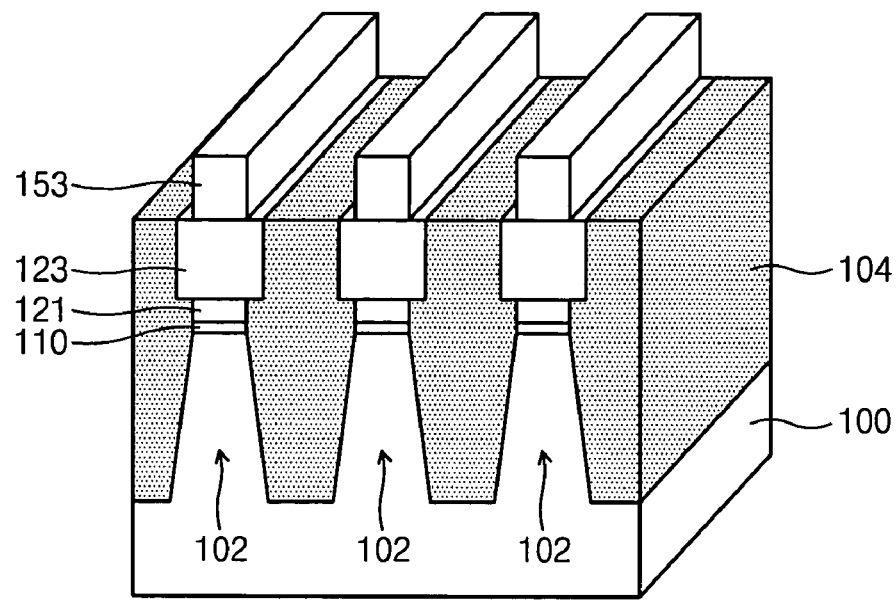
FIGS. 9A to 9D are diagrams illustrating a method of manufacturing a nonvolatile memory device according to example embodiments.

FIGS. 9A to 9D are diagrams for illustrating a method of manufacturing a nonvolatile memory device according to example embodiments. Because the process steps described with reference to FIGS. 7A-7D are identically employed in the manufacturing method below, their detailed description will be omitted. Referring to FIG. 9A, a mask layer may be formed on the second conductive layer 123 and the device isolation pattern 104 shown in FIG. 7D, and may then be patterned to form a mask pattern 153. The mask pattern 153 may allow both sides of the upper surface of the second conductive layer 123 to be exposed, may be parallel to the second conductive layer 123, and may have a smaller width than the second conductive layer 123. The mask pattern 123 may have a width smaller than a minimum line width.

Figure 9B:
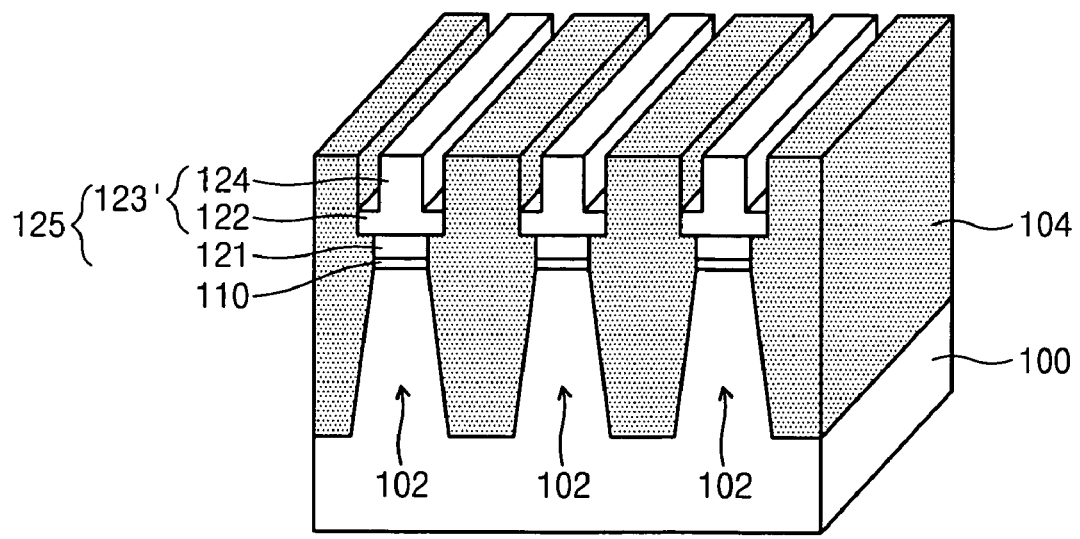

Referring to FIG. 9B, both sides of the upper surface of the second conductive layer 123 may be etched using the mask pattern 153 as an etch mask to form a second conductive pattern 123'. An upper portion of the second conductive pattern 123' may be smaller in width than a lower portion of the second conductive pattern 123'. A section of the second conductive pattern 123' may have an inverse T shape. The second conductive pattern 123' and the first conductive pattern 121 may form a floating gate pattern 125. The floating gate pattern 125 may have a cross-shaped section as taken along a direction (e.g., direction of control gate electrode to be formed) perpendicular to the active region. The mask pattern 153 may be removed. Because the second conductive layer 123 in FIGS. 2A-2D is isotropically etched, the corner of the second conductive pattern 123' may be rounded. The second conductive pattern 123' shown in FIG. 9B according to the example embodiment in FIGS. 4A-4D may have an angled corner. This angled corner may be only an example showing that the second conductive layer may be etched by a dry etching method, but the second conductive pattern may be not limited thereto. For example, the second conductive layer may be isotropically etched by, for example, a wet etch, so that the corner of the second conductive pattern 123' shown in FIG. 9B may be rounded.

Figure 9C:
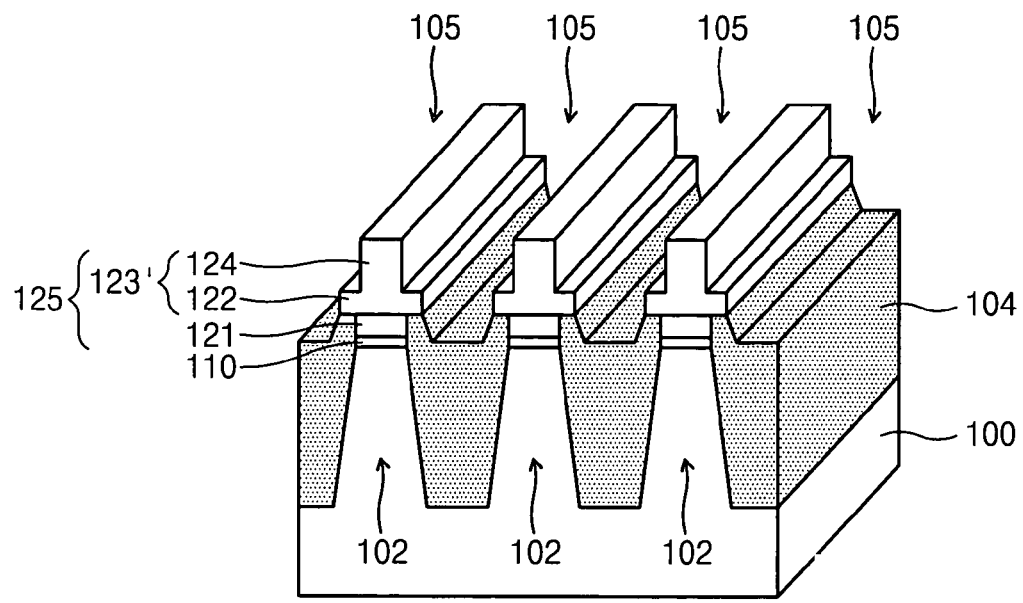

Referring to FIG. 9C, the exposed upper surface of the device isolation pattern 104 may be etched using the second conductive pattern 123' as an etch mask. The upper surface of the device isolation pattern 104 may be recessed, so that it may be leveled lower than the first conductive pattern 121 between the floating gate patterns. In FIG. 9C, the recess 105 may have an angled shape at an edge thereof and/or may have a rounded shape. Because the width of the second conductive pattern 123' is larger than the width of the underlying active region 102, the active region 102 and the gate insulation layer 110 may reduce or prevent damage during the recessing of the device isolation pattern 104.

Figure 9D:
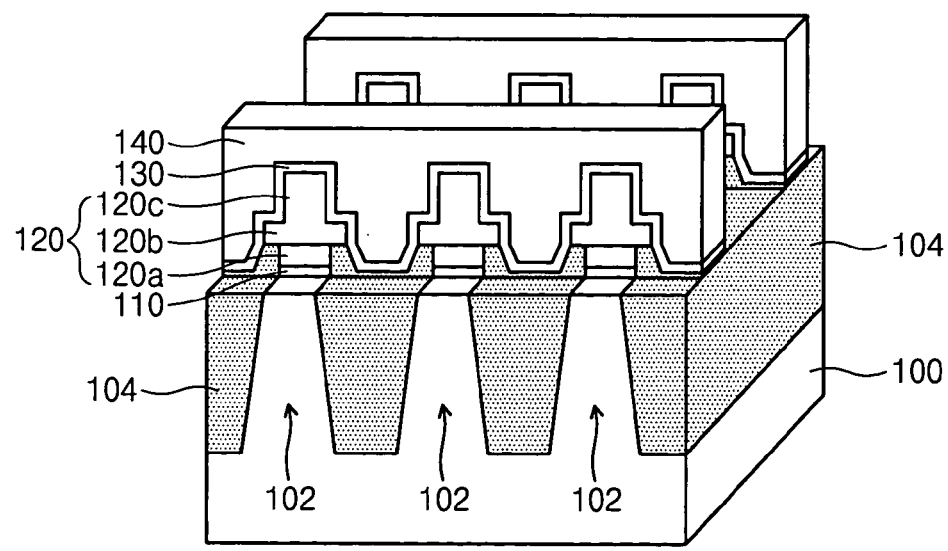

Referring to FIG. 9D, a word line structure crossing over the active region may be formed on the resultant substrate having the device isolation pattern of which the upper surface is recessed. The word line structure may include the floating gate electrode 120, the intergate dielectric layer 130 and the control gate electrode 140 sequentially stacked. Forming the word line structure may include sequentially forming an intergate dielectric layer and a control gate conductive layer on the resultant substrate having the device isolation pattern of which the upper surface is recessed, and patterning the control gate conductive layer, the intergate dielectric layer and the floating gate pattern 125 to expose the active region 102. By patterning, the first conductive pattern 121, the lower portion 122 of the second conductive pattern and the upper portion 124 of the second conductive pattern constituting the floating gate pattern 125 may be respectively changed into a lower gate pattern 120a, a middle gate pattern 120b and an upper gate pattern 120c to form the floating gate electrode 120. Because spacing between the upper portions 124 of the adjacent floating gate patterns is wider than that between the lower portions 122 of the adjacent floating gate patterns, the control gate conductive layer may be formed without any void. The formed floating gate electrode 120 may have a cross shaped section as taken along a direction perpendicular to the active region 102, e.g., a direction extending along the control gate electrode 140. The floating gate electrode 120 may have a rectangular shaped section as taken along a direction parallel to the active region 102. Impurity ions may be implanted into the active region using the word line structure as a mask, to form an impurity region (103 of FIG. 4C).

Figure 10A:
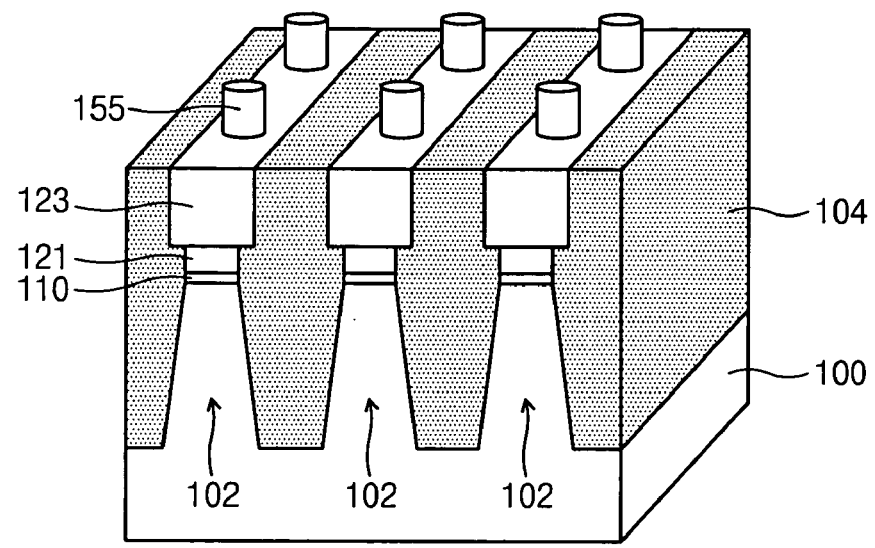
FIGS. 10A to 10D are diagrams illustrating a method of manufacturing a nonvolatile memory device according to example embodiments.

FIGS. 10A to 10D are diagrams for illustrating a method of manufacturing a nonvolatile memory device according to example embodiments. Because the process steps described with reference to FIGS. 7A-7D are employed in the manufacturing method below, their detailed description will be omitted. Referring to FIG. 10A, a mask layer may be formed on the second conductive layer 123 and the device isolation pattern 104 shown in FIG. 7D, and may then be patterned to form a pillar-shaped mask pattern 155 having a width narrower than the second conductive layer 123. The mask pattern 155 may be cylindrically shaped. The mask pattern 155 may have a smaller width than the second conductive layer 123. The mask pattern 155 may have a width smaller than a minimum line width.

Figure 10B:
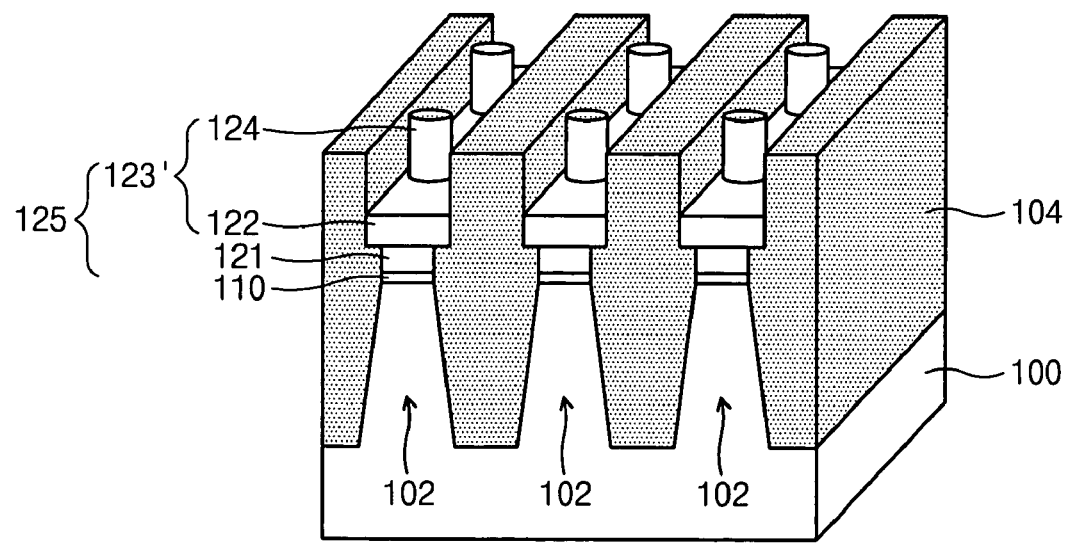

Referring to FIG. 10B, the upper surface of the second conductive layer 123 may be etched using the mask pattern 155 as an etch mask to form a second conductive pattern 123'. An upper portion 124 of the second conductive pattern 123' may be smaller in width than a lower portion 122 of the second conductive pattern 123'. The second conductive pattern 123' may have an inverse T-shaped section in all directions. The second conductive pattern 123' and the first conductive pattern 121 form a floating gate pattern 125. The floating gate pattern 125 may have a cross-shaped section as taken along a direction (e.g., direction of control gate electrode to be formed) perpendicular to the active region. The mask pattern 155 may be removed after the second conductive pattern 123' is formed.

Because the second conductive layer 123 in FIGS. 2A-2D is isotropically etched, the corner of the second conductive pattern 123' may be rounded. However, the second conductive pattern 123' shown in FIG. 10B according to the example embodiment of FIGS. 5A-5D may have an angled corner. The second conductive layer 123 may be etched by a dry etching method, but the second conductive pattern 123' may not be necessarily limited to such a structure. For example, the second conductive layer may be isotropically etched by, for example, a chemical dry etch, so that the corner of the second conductive pattern 123' may be rounded like in the example embodiment illustrated in FIGS. 2A-2D.

Figure 10C:
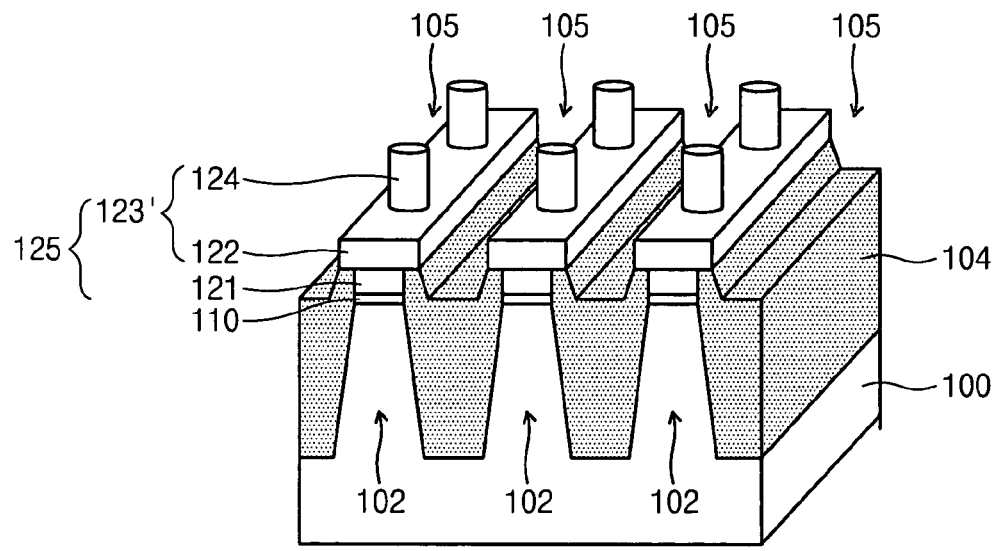

Referring to FIG. 10C, the exposed upper surface of the device isolation pattern 104 may be etched using the second conductive pattern 123' as an etch mask. The upper surface of the device isolation pattern 104 may be recessed, so that it may be leveled lower than the first conductive pattern 121 between the floating gate patterns. In FIG. 10C, the recess 105 may have an angled shape at an edge thereof and/or may have a rounded shape. Because the width of the second conductive pattern 123' is larger than the width of the underlying active region 102, the active region 102 and the gate insulation layer 110 may reduce or prevent damage during the recessing of the device isolation pattern 104.

Figure 10D:
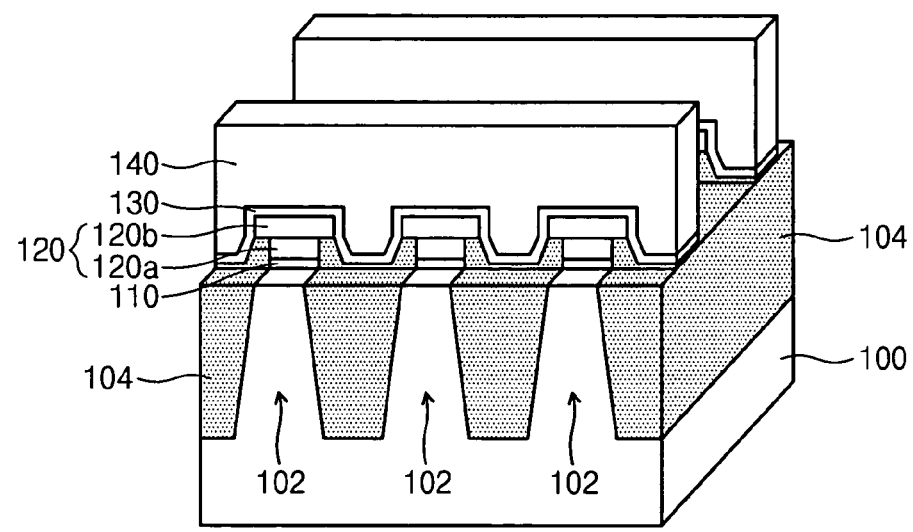

Referring to FIG. 10D, a word line structure crossing over the active region may be formed on the resultant substrate having the device isolation pattern of which upper surface is recessed. The word line structure may include the floating gate electrode 120, the intergate dielectric layer 130 and the control gate electrode 140 sequentially stacked. Forming the word line structure may include sequentially forming an intergate dielectric layer and a control gate conductive layer on the resultant substrate having the device isolation pattern of which the upper surface is recessed, and patterning the control gate conductive layer, the intergate dielectric layer and the floating gate pattern 125 to expose the active region 102. By patterning, the first conductive pattern 121, the lower portion 122 of the second conductive pattern and the upper portion 124 of the second conductive pattern constituting the floating gate pattern 125 may be respectively changed into a lower gate pattern 120a, a middle gate pattern 120b and an upper gate pattern 120c to form the floating gate electrode 120. Because spacing between the upper portions 124 of the adjacent floating gate patterns may be wider than that between the lower portions 122 of the adjacent floating gate patterns, the control gate conductive layer may be formed without any void.

In the example embodiment illustrated in FIGS. 5A-5D, because the control gate electrode 140 may be wider than the upper portion of the second conductive pattern 124, the upper portion of the floating gate electrode may be covered with the control gate electrode 140. The floating gate electrode 120 may have a cross shaped section as taken along a direction extending along the control gate electrode 140, and may have an inverse T shaped section as taken along a direction parallel to the active region 102. Impurity ions having a conductive type opposite to that of the substrate may be implanted into the active region using the word line structure 'GL' as a mask, to form an impurity region (103 of FIG. 5C).

Figure 11A:
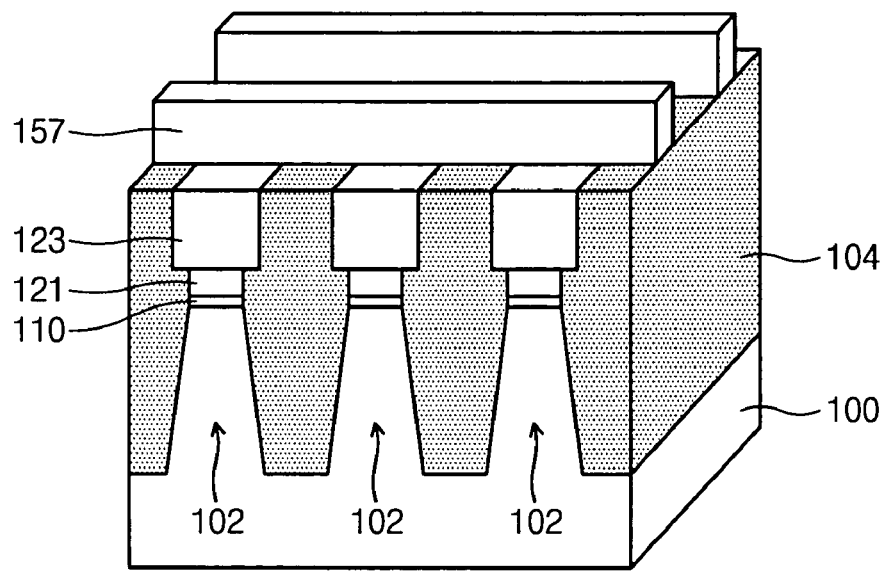
FIGS. 11A to 11F are diagrams illustrating a method of manufacturing a nonvolatile memory device according to example embodiments.

FIGS. 11A to 11F are diagrams illustrating a method of manufacturing a nonvolatile memory device according to example embodiments. Because the process steps described with reference to FIGS. 7A-7D are identically employed in the manufacturing method below, their detailed description will be omitted. Referring to FIG. 11A, a mask layer may be formed on the second conductive layer 123 and the device isolation pattern 104 shown in FIG. 7D, and may then be patterned to form a mask pattern 157 arranged in a direction crossing the second conductive layer 123. The mask pattern 157 may be formed parallel to a site where the control gate electrode is being formed, and may be narrower in width than the control gate electrode. The mask pattern 157 may have a width smaller than a minimum line width.

Figure 11B:
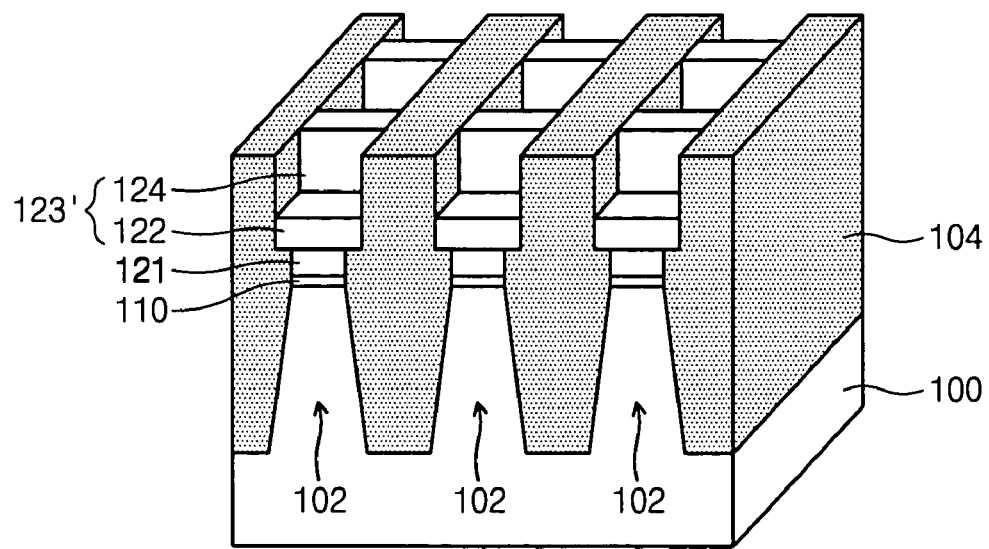
Figure 11C:
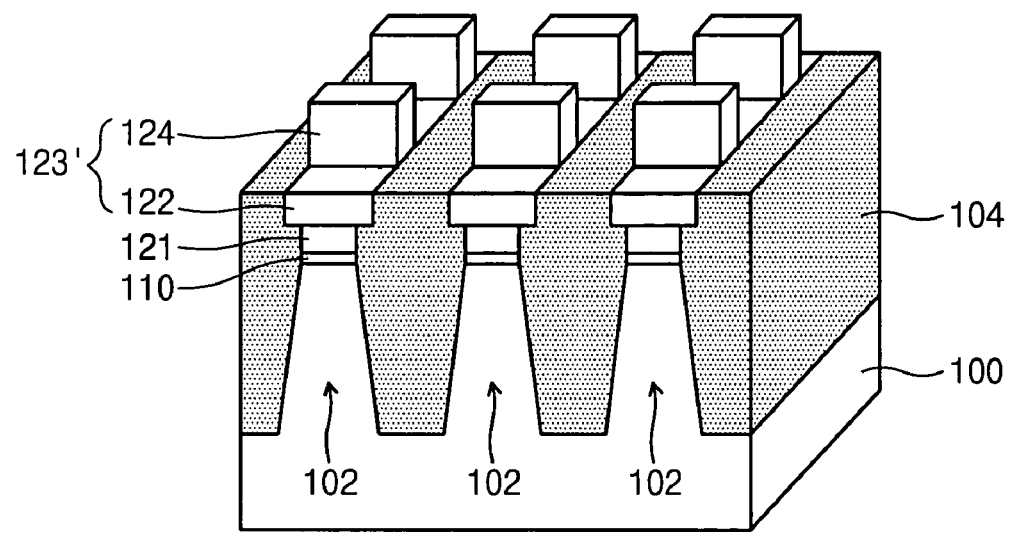

Referring to FIG. 11B, the upper surface of the second conductive layer 123 may be etched using the mask pattern 157 as an etch mask to form a second conductive pattern 123'. An upper portion 124 of the second conductive pattern 123' may be smaller in width than a lower portion 122 of the second conductive pattern 123'. The second conductive pattern 123' may have an inverse T-shaped section as taken along a direction extending along the active region. The mask pattern 157 may be removed after the second conductive pattern 123' is formed. Referring to FIG. 11C, the device isolation pattern 104 may be recessed to expose an upper side surface of the second conductive pattern 123'. The recessing may be performed by a blanket etch and/or wet etch of the device isolation pattern under an etch condition that an etch selectivity for the device isolation pattern over the second conductive layer may be higher.

Figure 11D:
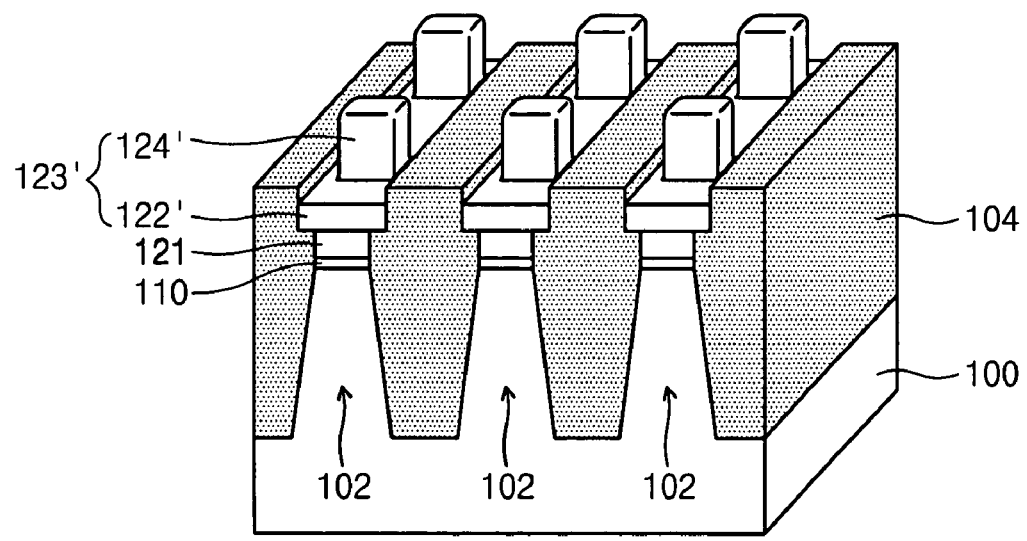

Referring to FIG. 11D, the second conductive pattern 123' may be isotropically etched. An upper portion 124' of the isotropically etched second conductive pattern 123' may have a narrower width than that of the lower portion 122' of the second conductive pattern 123'. The second conductive pattern 123' may have an inverse T-shaped section in all directions. The second conductive pattern 123' may be bonded to the first conductive pattern 121 to form a floating gate pattern 125. The formed floating gate pattern 125 may have a cross-shaped section as taken along a direction (e.g., direction of control gate electrode to be formed) perpendicular to the active region. The isotropic etching of the second conductive pattern 123' may be performed by an etching method that selectively etches the second conductive layer 123 over the device isolation pattern 104. A wet etching method and/or a chemical dry etching method using fluorine (F) gas may be used. In the chemical dry etching method, a bias may not be applied to the substrate for the isotropic etching. As the second conductive pattern 123' is isotropically etched, a corner of a boundary between the upper portion 124' of the second conductive pattern and the lower portion 122' of the second conductive pattern 123' may have a rounded shape. A corner of the upper portion 124' of the second conductive pattern may be rounded.

Figure 11E:
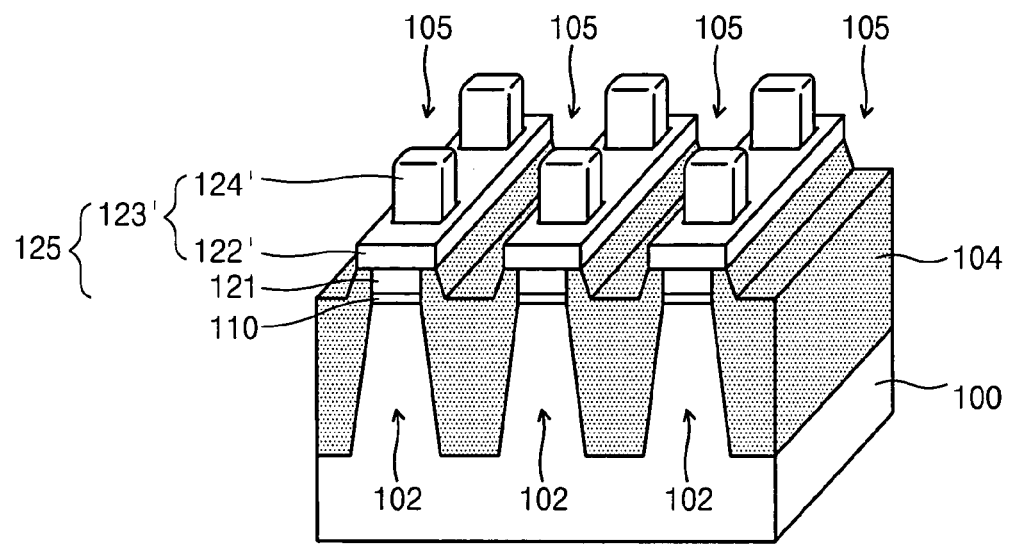

Referring to FIG. 11E, the exposed upper surface of the device isolation pattern 104 may be etched using the second conductive pattern 123' as an etch mask. The upper surface of the device isolation pattern 104 may be recessed, so that it may be leveled lower than the first conductive pattern 121 between the floating gate patterns. In FIG. 11E, the recess 105 may have an angled shape at an edge thereof and/or a rounded shape. Because the width of the second conductive pattern 123' is larger than the width of the underlying active region 102, the active region 102 and the gate insulation layer 110 may reduce or prevent damage due to an etching during the recessing of the device isolation pattern 104.

Figure 11F:
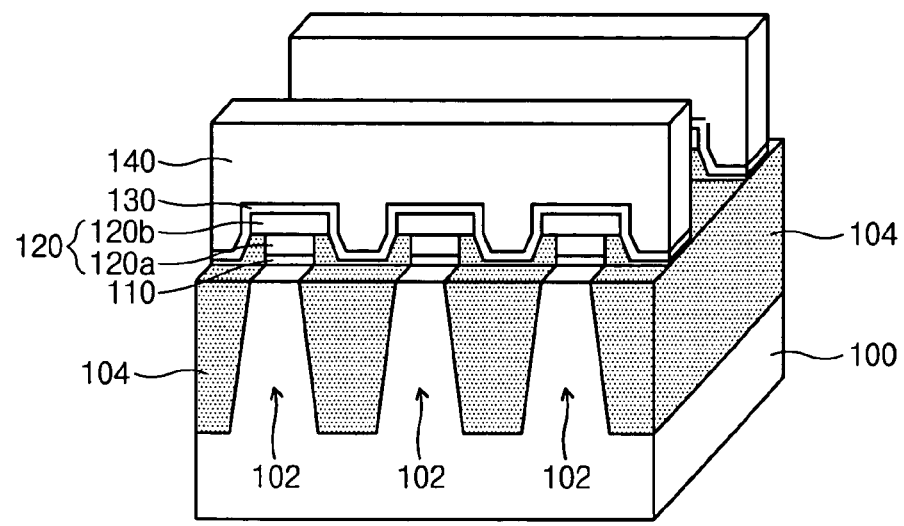

Referring to FIG. 11F, a word line structure crossing over the active region may be formed on the resultant substrate having the device isolation pattern 104 of which the upper surface is recessed. The word line structure may include the floating gate electrode 120, the intergate dielectric layer 130 and the control gate electrode 140 sequentially stacked. Forming the word line structure may include sequentially forming an intergate dielectric layer and a control gate conductive layer on the resultant substrate having the device isolation pattern of which the upper surface is recessed, and patterning the control gate conductive layer, the intergate dielectric layer and the floating gate pattern 125 to expose the active region 102. By patterning, the first conductive pattern 121, the lower portion 122 of the second conductive pattern and the upper portion 124 of the second conductive pattern constituting the floating gate pattern 125 may be respectively changed into a lower gate pattern 120a, a middle gate pattern 120b and an upper gate pattern 120c to form the floating gate electrode 120. Because spacing between the upper portions 124 of the adjacent floating gate patterns is wider than that between the lower portions 122 of the adjacent floating gate patterns, the control gate conductive layer may be formed without any void.

In example embodiments, because the control gate electrode 140 is wider than the upper portion of the second conductive pattern 124 constituting the floating gate electrode, the upper portion of the floating gate electrode may be covered with the control gate electrode 140. The formed floating gate electrode 120 may have a cross shaped section as taken along a direction extending along the control gate electrode 140, and may have an inverse T shaped section as taken along a direction parallel to the active region 102. Impurity ions having a conductive type opposite to that of the substrate may be implanted into the active region using the word line structure 'GL' as a mask, to form an impurity region (103 of FIG. 6C). The mask patterns 155 and 157 of example embodiments may have a narrower width than a minimum line width. However, the mask patterns 155 and 157 may have a narrower width than the minimum line width. Methods of forming a mask pattern having a narrower width than the minimum line width may be disclosed. It may be apparent that example embodiments may not be limited to the example methods but may be applied to various methods.

Figure 12A:
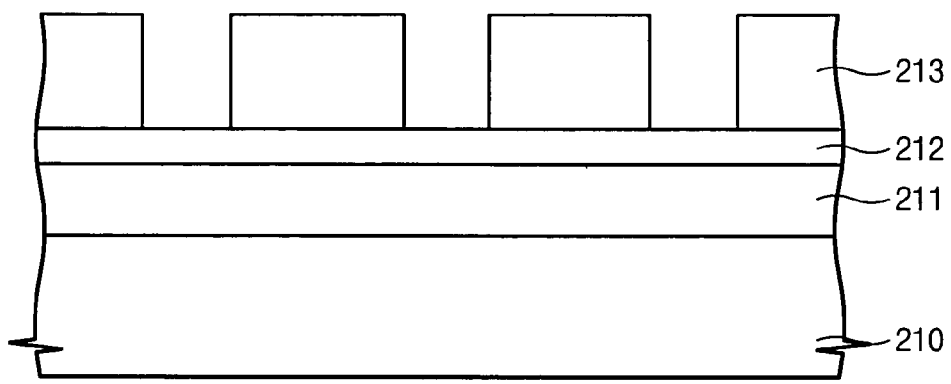
FIGS. 12A to 12E are diagrams illustrating a method of forming a mask pattern having a width smaller than a minimum circuit line width according to example embodiments.

FIGS. 12A to 12E are diagrams illustrating a method of forming a mask pattern having a width smaller than a minimum circuit line width according to example embodiments. Referring to FIG. 12A, an antireflective layer 211 and a hard mask layer 212 may be formed on a semiconductor substrate 210. The antireflective layer may be formed of an organic antireflection coating (ARC) having a lower reflectivity. The hard mask layer 212 may be, for example, a silicon oxynitride layer and/or a silicon nitride layer having a thickness of about 400 Å. A photoresist film not containing silicon may be coated on the hard mask layer 212 and then may undergo a conventional exposure and development process, so that a photoresist pattern 213 with a minimum line width may be formed. In other methods, another photoresist film may be used instead of the antireflective layer 211 and the hard mask layer 212.

Figure 12B:
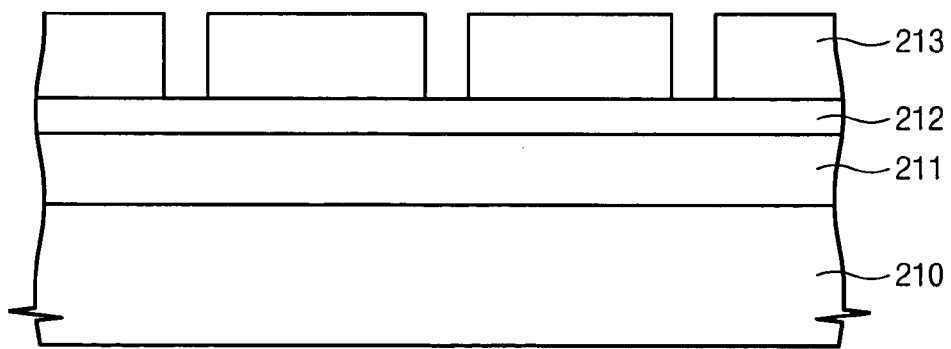
Figure 12C:
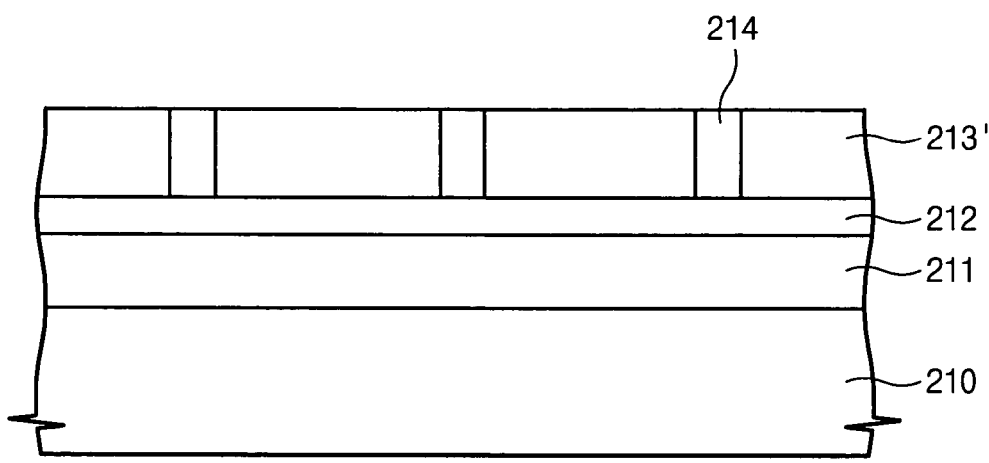

Referring to FIG. 12B, the photoresist pattern 213 may be transformed into a photoresist pattern 213' having a narrower spacing than that in the original state by a flow process. The spacing between the photoresist patterns 213' may be decreased by a spacing ranging from about 10 nm to about 40 nm. The flow process may be performed by thermally annealing the photoresist pattern 213 in a temperature range of about 120° C. to about 150° C. Referring to FIG. 12C, the spaces between the photoresist patterns 123' may be filled with a silicon-containing organic material layer 214. The silicon-containing organic material layer 214 may be a photoresist film containing silicon, for example, a photoresist film of ArF, KrF and/or $F_2$.

Figure 12D:
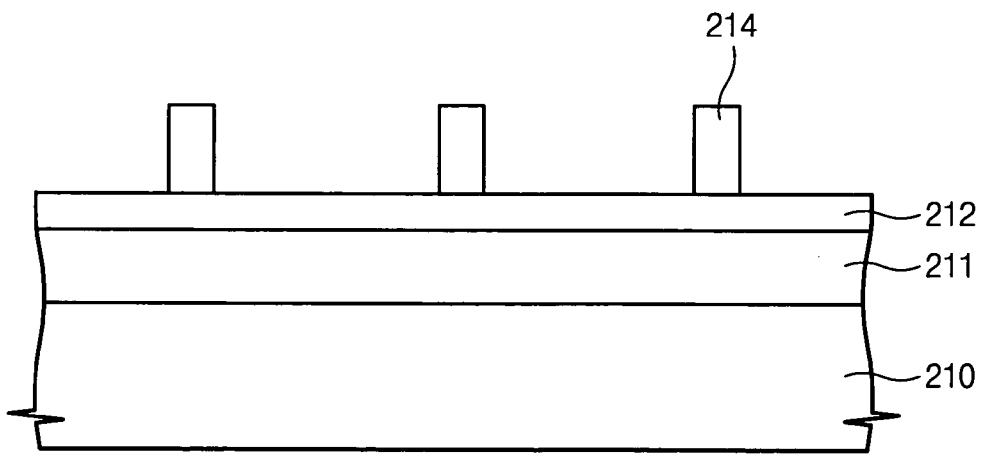

Referring to FIG. 12D, the photoresist pattern 213' not containing silicon may be selectively removed to form an organic pattern 214' including silicon. For selective removal of the photoresist pattern 213' not containing silicon, an oxygen plasma and/or dry etching process may be performed. When the oxygen plasma is used, argon (Ar), chlorine ($Cl_2$), sulfur dioxide ($SO_2$) and/or $CF_4$ gas may be additionally included.

Figure 12E:
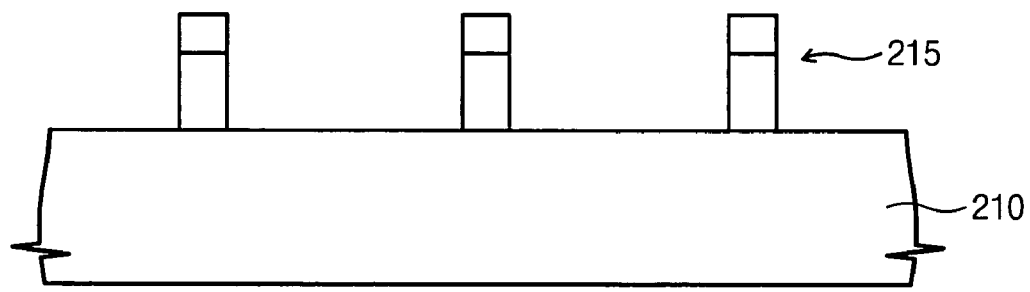
Figure 13:
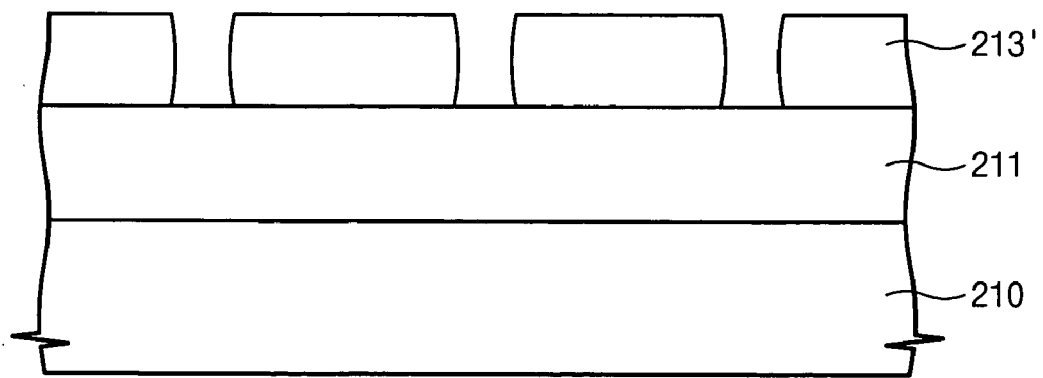

Referring to FIG. 12E, the hard mask layer 212 and the antireflective layer 211 may be etched using the organic pattern 214' containing silicon as an etch mask to form a mask pattern 215 having a narrower width than the minimum line width. When the photoresist pattern 213 undergoes a flow process like in FIG. 12B, the spacing between the photoresist patterns 213' may be effectively decreased. However, because the photoresist patterns 213' may have curved side surfaces as shown in FIG. 13, the spacing between the photoresist patterns 123' may not be accurately defined.

Figure 14A:
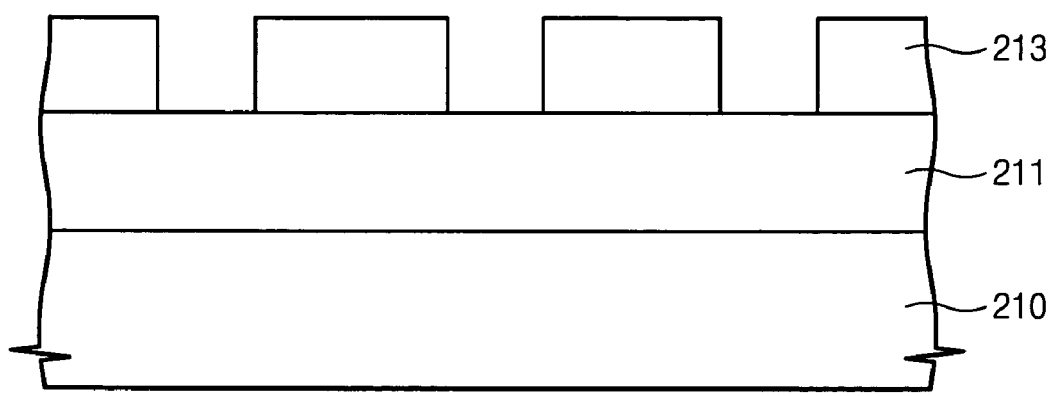
FIGS. 14A to 14C are diagrams illustrating an example to decrease a spacing between photoresist patterns.
Figure 14B:
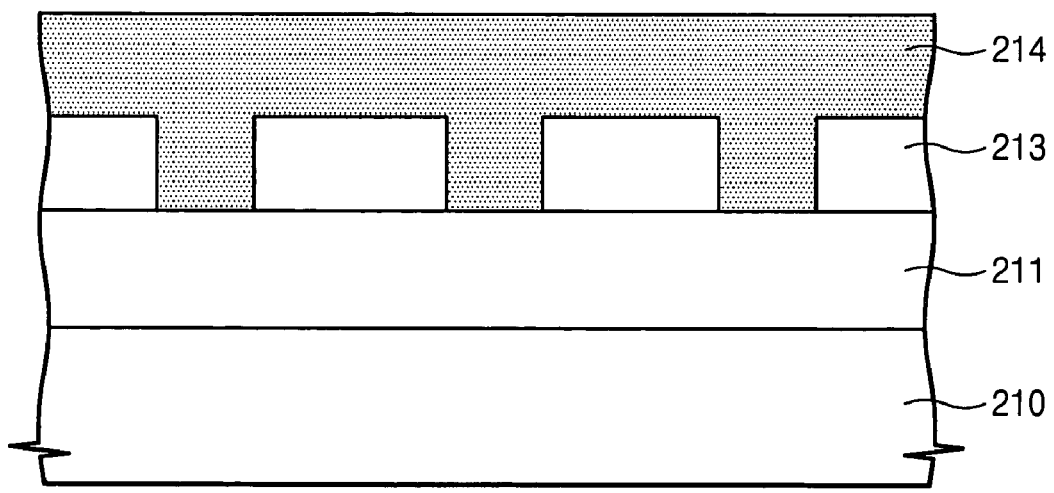
Figure 14C:
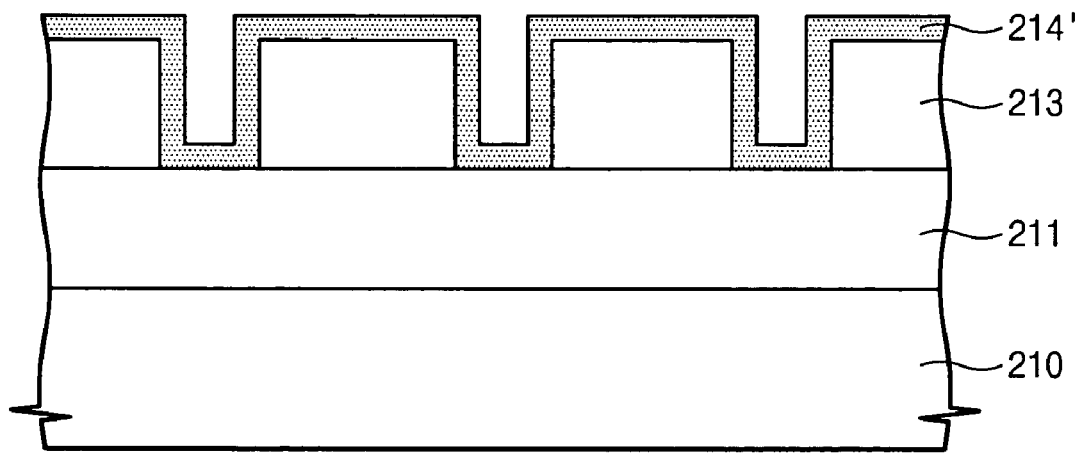

FIGS. 14A to 14C are diagrams illustrating an example to decrease a spacing between photoresist patterns using a method other than the flow process. Referring to FIG. 14A, in a similar method to that in FIG. 12A, a first photoresist film may be coated on a semiconductor substrate 210, and then exposed and developed to form a first photoresist pattern 213. If necessary, a hard mask layer, an antireflective layer and/or a stack layer 211 of the hard mask layer and the antireflective layer may be further formed on the semiconductor substrate 210. The first photoresist pattern 213 may be formed with a minimum line width that may be defined in the exposure process.

Referring to FIGS. 14B and 14C, an organic layer 214 may be formed on the first photoresist pattern 213. The organic layer 214 may be a photoresist film. A second photoresist pattern 214' may be formed using a chemical attachment process. In the chemical attachment process, the second photoresist film 214 formed on the first photoresist pattern 213 may be baked in a temperature range of about 110° C. to about 150° C. The second photoresist film 214 may react with an acid left on a surface of the first photoresist pattern 213, so that a portion of the second photoresist film 214 closely contacting the first photoresist pattern 213 may be bonded to the first photoresist pattern 213 in a polymer form. The resultant substrate on which the first photoresist pattern 213 may be bonded in a polymer form is rinsed to remove a non-reacted second photoresist film. Only the second photoresist film in the polymer form may be left on the sidewalls and upper surfaces of the first photoresist patterns. A second photoresist pattern 214' may be formed and the spacing between the second photoresist patterns 214' may be decreased by about 10 nm to about 40 nm so that it may have spacing below the minimum line width.

Figure 15A:
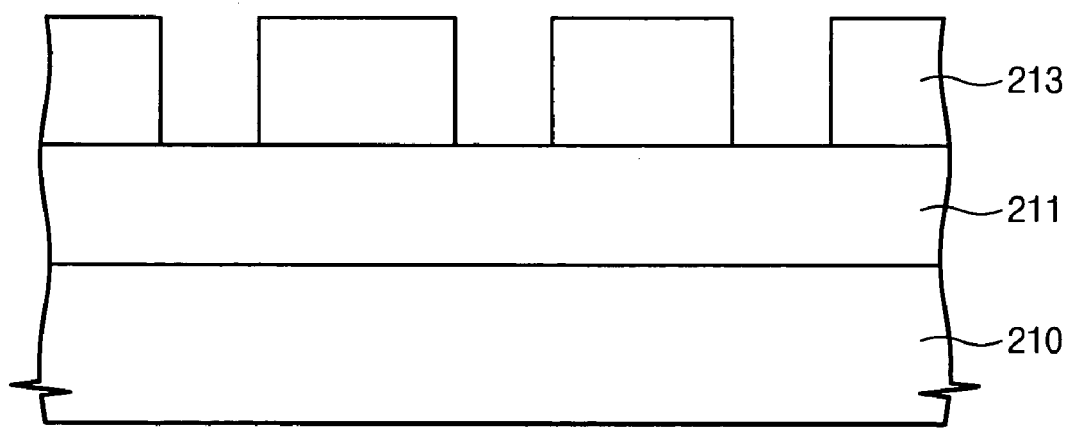
Figure 15B:
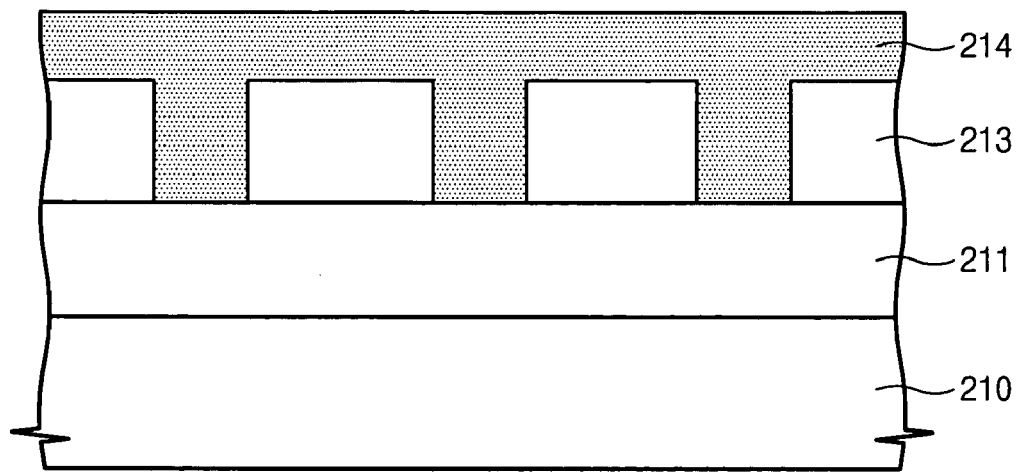

FIGS. 15A to 15D are diagrams illustrating another example to decrease a spacing between photoresist patterns using a method other than the flow process of the photoresist pattern. Referring to FIG. 15A, in a similar method to that in FIG. 12A, a photoresist film may be coated on a semiconductor substrate 210, and then exposed and developed to form a photoresist pattern 213. If necessary, a hard mask layer, an antireflective layer and/or a stack layer 211 of the hard mask layer and the antireflective layer may be further formed on the semiconductor substrate 210. The photoresist pattern 213 may be formed with a minimum line width that may be defined in the exposure process. Referring to FIG. 15B, an organic layer 214 may be formed on the photoresist pattern 213 to fill spaces between the photoresist patterns 213. The organic layer 214 may be a photoresist film.

Figure 15C:
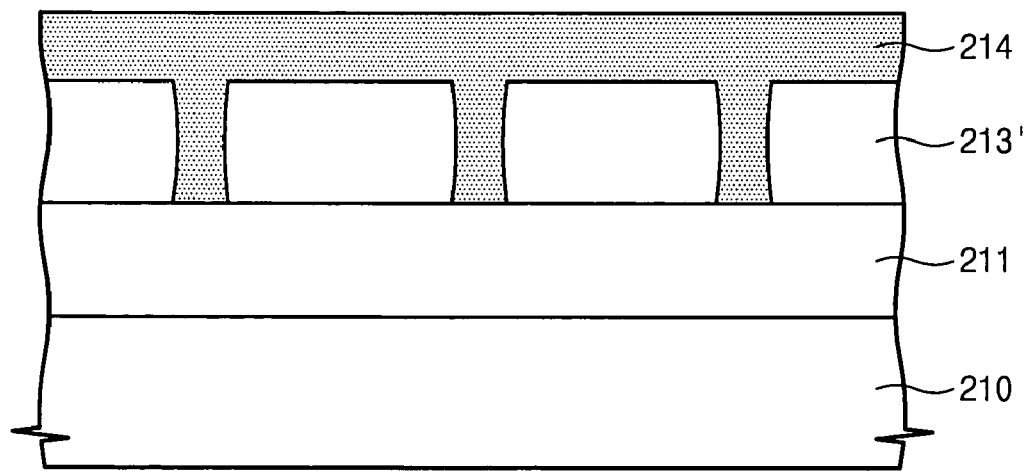
Figure 15D:
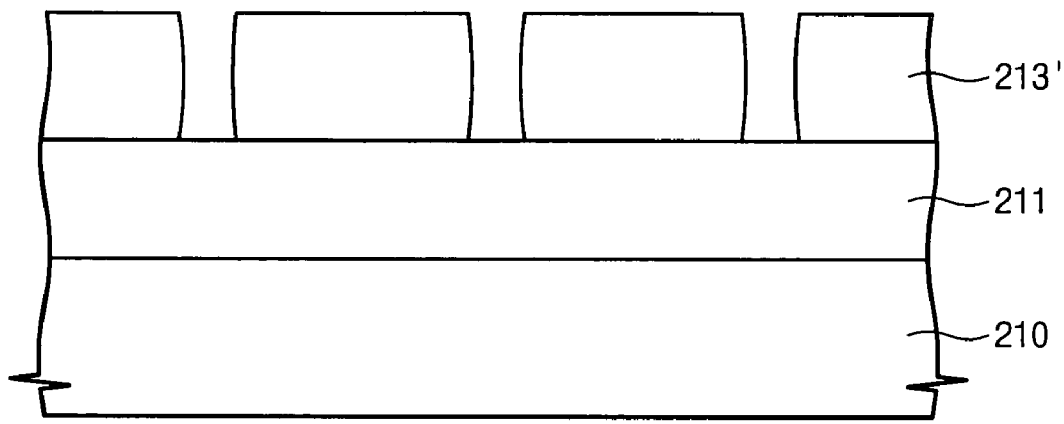

Referring to FIGS. 15C and 15D, the photoresist pattern 213 covered with the organic layer 214 may be flowed. The photoresist pattern 213 may be transformed into a photoresist pattern 213' having a narrower spacing than that between the photoresist patterns 213. Unlike in the flow process in FIG. 12B, because the upper surface of the photoresist pattern 213 may be covered with the organic layer 214, the transformation of the photoresist pattern 213 into the photoresist pattern 213' may decrease the curving of the sidewall of the photoresist pattern 213'. The photoresist pattern having a more accurate shape than that of FIG. 13 may be defined. The organic layer 214 may be selectively removed. The spacing between the photoresist patterns 213' may be decreased by about 10 nm to about 40 nm. The flow process may be performed by thermally annealing the photoresist pattern 213 in a temperature range of about 120° C. to about 150° C.

According to example embodiments, the floating gate electrode may have a cross-shaped section as taken along a direction extending along the control gate electrode. The floating gate electrode may have an inverse T-shaped section as taken along a direction extending along an active region. Example embodiments may decrease the sectional area of the floating gate electrode and increase the distance between the floating gate electrodes. By doing so, example embodiments may reduce or minimize an interference effect due to a control gate electrode and a floating gate electrode of adjacent word lines or an interference effect due to the floating gate electrodes on the same word line. Because the decrease in the interference effect makes it possible to secure a process margin that may increase the surface area of the floating gate electrode, the floating gate electrode of example embodiments may increase the coupling ratio without increasing the interference effect. The nonvolatile memory device according to example embodiments may overcome the electrical interference increase and the coupling ratio decrease problems due to higher integration.

The above-disclosed subject matter is to be considered illustrative, and not restrictive, and the appended claims are intended to cover all such modifications, enhancements, and other embodiments, which fall within the true spirit and scope of example embodiments. To the maximum extent allowed by law, the scope of example embodiments is to be determined by the broadest permissible interpretation of the following claims and their equivalents, and shall not be restricted or limited by the foregoing detailed description.

What is claimed is:

1. A nonvolatile memory device comprising:
   a device isolation pattern in a substrate to define an active region;
   a floating gate electrode on the active region and a section of which taken along a direction has a cross shape;
   a gate insulation layer between the floating gate electrode and the active region;
   a control gate electrode on the floating gate electrode to cross the active region; and
   an intergate dielectric layer between the control gate electrode and the floating gate electrode.

2. The nonvolatile memory device of claim 1, wherein the direction corresponds to a direction extending along the control gate electrode.

3. The nonvolatile memory device of claim 2, wherein a section of the floating gate electrode taken along a direction extending along the active region has a rectangle or an inverse T shape.

4. The nonvolatile memory device of claim 1, wherein the floating gate electrode includes:
   a lower gate pattern on the gate insulation layer;
   a middle gate pattern on the lower gate pattern; and
   an upper gate pattern on the middle gate pattern,
   wherein the middle gate pattern is larger in width than the lower gate pattern and the upper gate pattern.

5. The nonvolatile memory device of claim 4, wherein a boundary between the middle gate pattern and the upper gate pattern has a rounded corner.

6. The nonvolatile memory device of claim 4, wherein the lower gate pattern is equal in width to an upper surface of the active region.

7. The nonvolatile memory device of claim 4, wherein the upper gate pattern is smaller in width than the control gate electrode and is covered with the control gate electrode.

8. The nonvolatile memory device of claim 1, wherein the control gate electrode has a bottom surface which is lower than a bottom surface of the floating gate electrode.

* * * * *